(12) United States Patent
Zhou et al.

(10) Patent No.: US 10,283,513 B1
(45) Date of Patent: May 7, 2019

(54) THREE-DIMENSIONAL MEMORY DEVICE WITH ANNULAR BLOCKING DIELECTRICS AND METHOD OF MAKING THEREOF

(71) Applicant: SANDISK TECHNOLOGIES LLC, Plano, TX (US)

(72) Inventors: Fei Zhou, Milpitas, CA (US); Raghuveer S. Makala, Campbell, CA (US); Rahul Sharangpani, Fremont, CA (US); Adarsh Rajashekhar, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/804,692

(22) Filed: Nov. 6, 2017

(51) Int. Cl.
| H01L 21/28 | (2006.01) |
| H01L 27/11556 | (2017.01) |
| H01L 21/8234 | (2006.01) |
| H01L 21/8239 | (2006.01) |
| H01L 27/11582 | (2017.01) |
| H01L 21/768 | (2006.01) |

(52) U.S. Cl.
CPC .... *H01L 27/11556* (2013.01); *H01L 21/8239* (2013.01); *H01L 21/823487* (2013.01); *H01L 27/11582* (2013.01); *H01L 21/768* (2013.01)

(58) Field of Classification Search
CPC ... H01L 21/8239; H01L 21/76; H01L 21/823; H01L 21/768; H01L 21/7682; H01L 21/76814; H01L 21/76817; H01L 21/28; H01L 21/76816; H01L 21/3213; H01L 21/32133; H01L 21/76841
USPC ...................................................... 257/315
See application file for complete search history.

(56) References Cited

U.S. PATENT DOCUMENTS

| 5,915,167 | A | 6/1999 | Leedy |
| 9,230,983 | B1 | 1/2016 | Sharangpani et al. |
| 9,496,419 | B2 | 11/2016 | Sharangpani et al. |
| 9,570,455 | B2 | 2/2017 | Sharangpani et al. |
| 9,613,977 | B2 | 4/2017 | Sharangpani et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Chuong A Luu
(74) *Attorney, Agent, or Firm* — The Marbury Law Group PLLC

(57) ABSTRACT

A memory opening is formed through an alternating stack of insulating layers and sacrificial material layers located over a substrate. Annular recesses are formed around the memory opening by laterally recessing the sacrificial material layers with respect to the insulating layers. Annular metal portions are formed over recessed sidewalls of the sacrificial material layers within each of the annular recesses by a selective deposition process. Annular backside blocking dielectrics are formed selectively on inner sidewalls of the annular metal portions employing a layer of a self-assembly material that covers surfaces of the insulating layers and inhibits deposition of a dielectric material thereupon. A memory stack structure is formed in the memory opening, and the sacrificial material layers are replaced with electrically conductive layers. The annular backside blocking dielectrics provide electrical isolation for the annular metal portions, which function as control gate electrodes.

11 Claims, 35 Drawing Sheets

(56) References Cited

U.S. PATENT DOCUMENTS

| | | | |
|---|---|---|---|
| 9,659,955 B1 | 5/2017 | Sharangpani et al. | |
| 9,659,956 B1 | 5/2017 | Pachamuthu et al. | |
| 9,698,152 B2 | 7/2017 | Peri et al. | |
| 9,698,223 B2 | 7/2017 | Sharangpani et al. | |
| 9,780,182 B2 | 10/2017 | Peri et al. | |
| 2013/0095646 A1* | 4/2013 | Alsmeier | H01L 27/11551 438/594 |
| 2014/0048868 A1 | 2/2014 | Kim et al. | |
| 2015/0111352 A1 | 4/2015 | Lee et al. | |
| 2016/0163725 A1 | 6/2016 | Kamiya et al. | |
| 2016/0163728 A1 | 6/2016 | Tsutsumi et al. | |
| 2017/0125436 A1 | 5/2017 | Sharangpani et al. | |
| 2017/0162597 A1 | 6/2017 | Sharangpani et al. | |

OTHER PUBLICATIONS

Yokoyama et al., "Low-Temperature Selective Deposition of Silicon on Silicon Nitride by Time-Modulated Disilane Flow and Formation of Silicon Narrow Wires," Applied Physics Letters, vol. 79, No. 4, Jul. 23, 2001.

Guo, Lei, "Selective Chemistry of Metal Oxide Atomic Layer Deposition on Si Based Substrate Surfaces," UC Riverside Electronic Theses and Dissertations, 2015.

Harsta et al., "Thermodynamic Investigation of Selective Molybdenum Chemical Vapour Deposition: Influence of Growth Conditions and Gas Additives on the Selectivity of the Process," Thin Solid Films, 185 (1990) pp. 235-246.

U.S. Appl. No. 15/413,034, filed Jan. 23, 2017, SanDisk Technologies LLC.

U.S. Appl. No. 15/624,006, filed Jun. 15, 2017, SanDisk Technologies LLC.

U.S. Appl. No. 15/633,131, filed Jun. 26, 2017, SanDisk Technologies LLC.

International Search Report and Written Opinion of the International Searching Authority for International Patent Application No. PCT/US2018/051987, dated Feb. 19, 2019, 13 pages.

\* cited by examiner

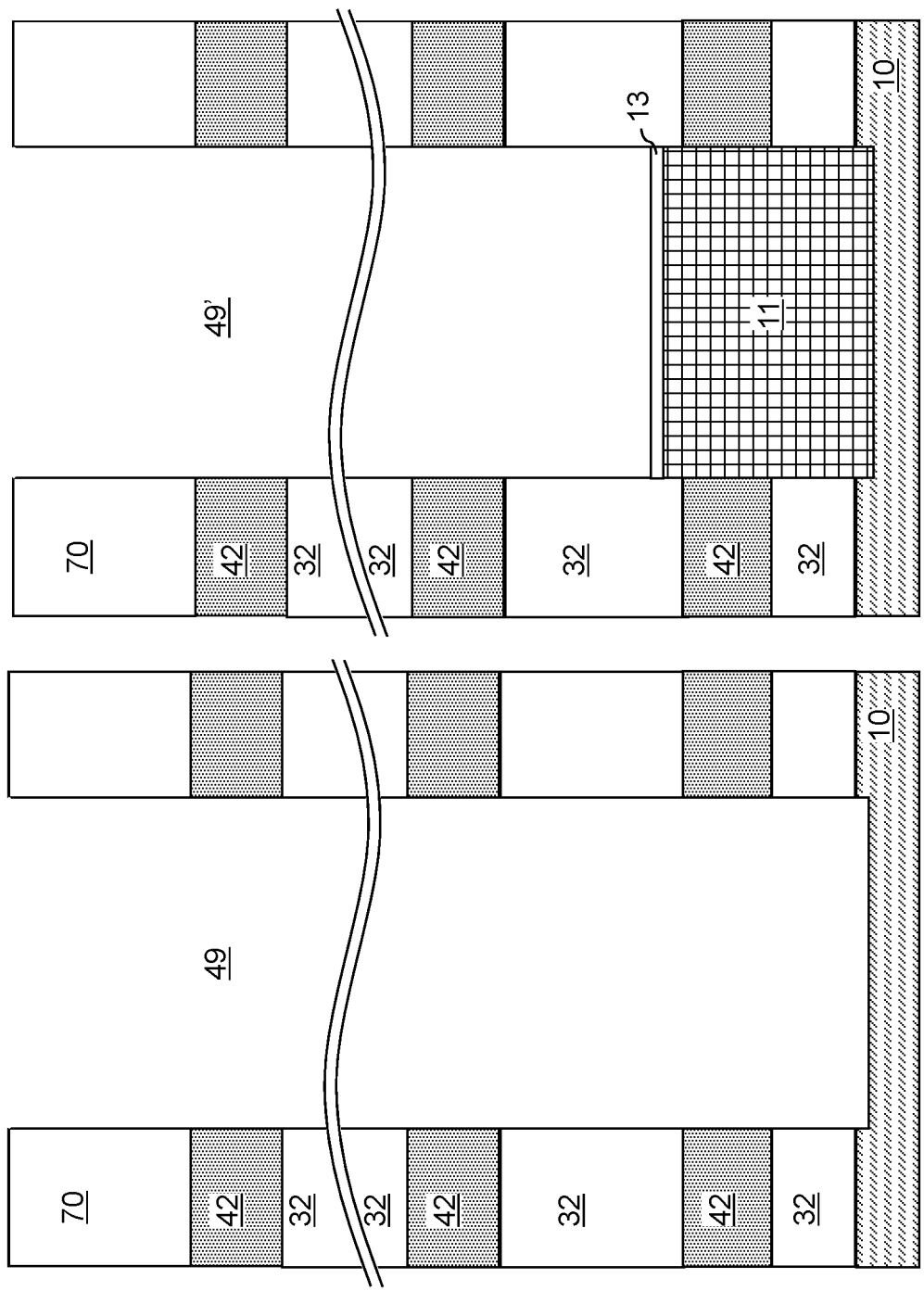

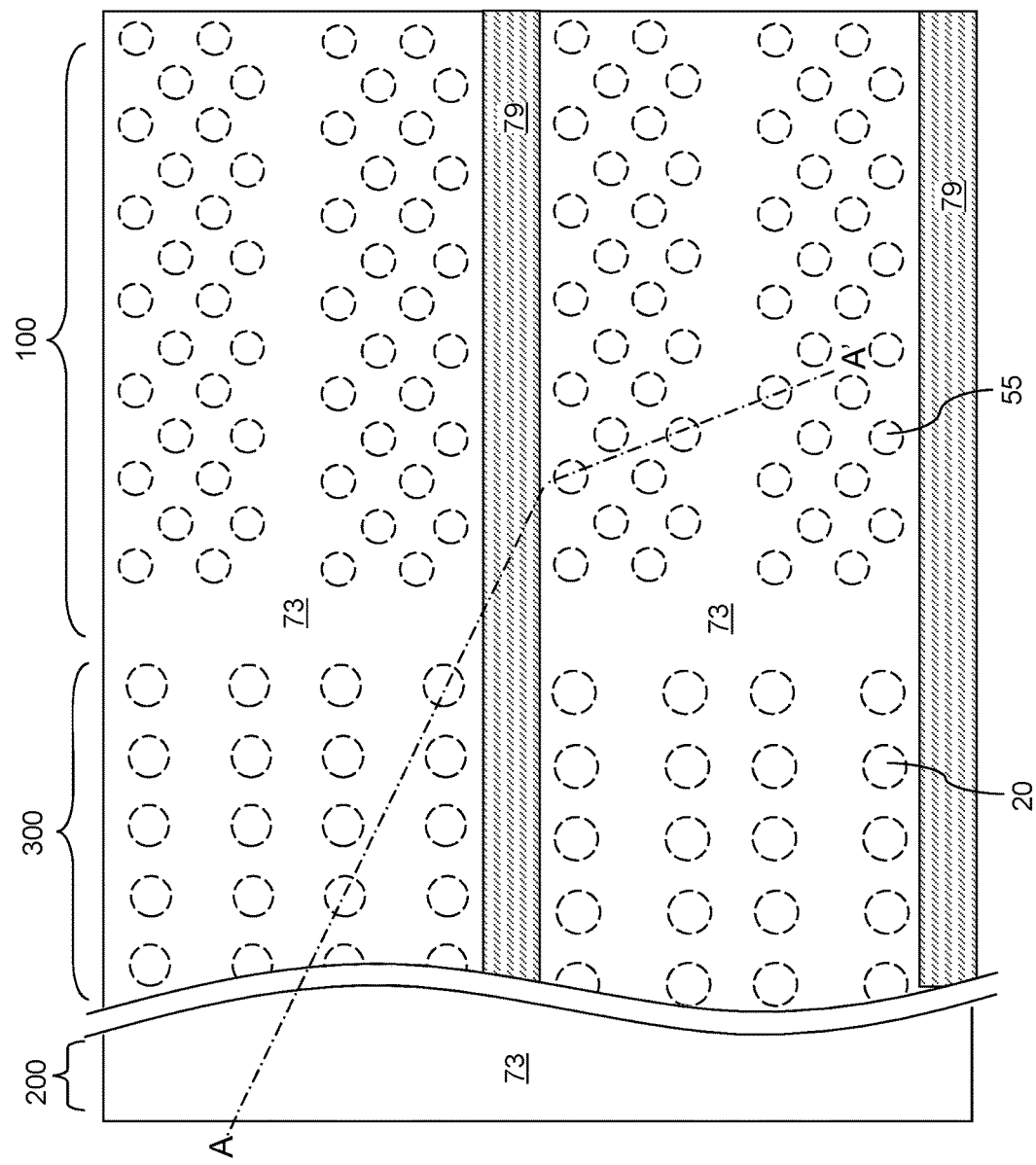

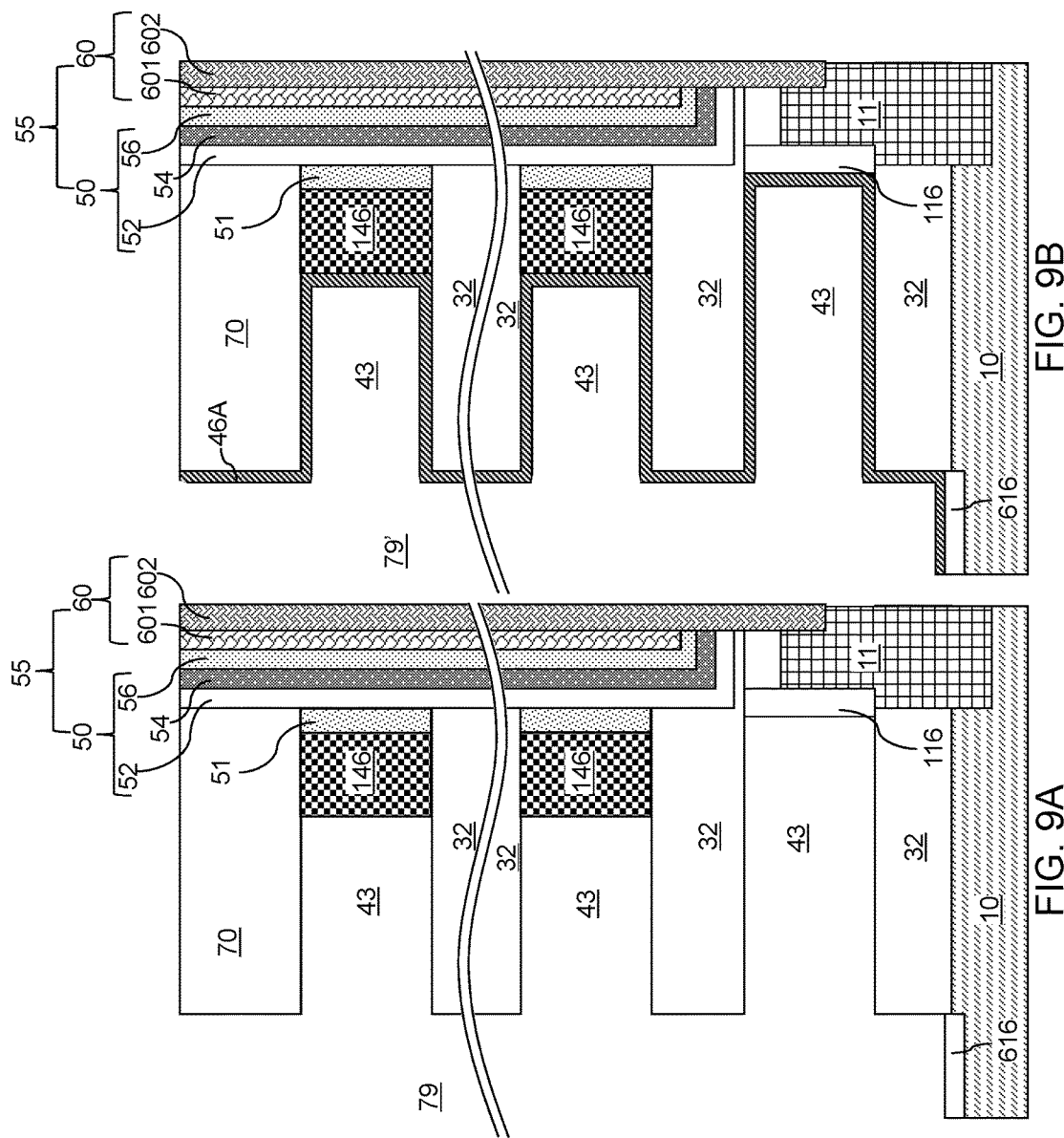

US 10,283,513 B1

THREE-DIMENSIONAL MEMORY DEVICE WITH ANNULAR BLOCKING DIELECTRICS AND METHOD OF MAKING THEREOF

FIELD

The present disclosure relates generally to the field of semiconductor devices, and particular to a three-dimensional memory device employing annular blocking dielectrics and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; a memory stack structure extending through the alternating stack, wherein the memory stack structure comprises a memory film and a vertical semiconductor channel contacting an inner sidewall of the memory film; annular backside blocking dielectrics located at levels of the electrically conductive layers and laterally surrounding the memory stack structure; and annular metal portions located at levels of the at least some of the of the electrically conductive layers and contacting and an outer sidewall of a respective one of the annular backside blocking dielectrics.

According to another aspect of the present disclosure, a method of forming a three-dimensional memory device is provided, which comprises: forming an alternating stack of insulating layers and sacrificial material layers over a substrate; forming a memory opening through the alternating stack; forming annular recesses around the memory opening by laterally recessing the sacrificial material layers with respect to the insulating layers; forming annular metal portions on recessed sidewalls of the sacrificial material layers within each of the annular recesses; forming annular backside blocking dielectrics on inner sidewalls of the annular metal portions; forming a memory stack structure on inner sidewalls of the annular backside blocking dielectrics in the memory opening, wherein the memory stack structure comprises a memory film and a vertical semiconductor channel contacting an inner sidewall of the memory film; and replacing the sacrificial material layers with electrically conductive layers.

BRIEF DESCRIPTION OF THE DRAWINGS

FIGS. 5A-5M are sequential schematic vertical cross-sectional views of a memory opening within the exemplary structure during formation of annular metal portions, annular backside blocking dielectrics, and a memory opening fill structure according to an embodiment of the present disclosure.

FIG. 7B is a partial see-through top-down view of the exemplary structure of FIG. 7A. The vertical plane A-A' is the plane of the schematic vertical cross-sectional view of FIG. 7A.

FIGS. 9A and 9B are sequential vertical cross-sectional views of a region of the exemplary structure during formation of backside recesses and a metallic barrier layer according to an embodiment of the present disclosure.

DETAILED DESCRIPTION

Figure 1:
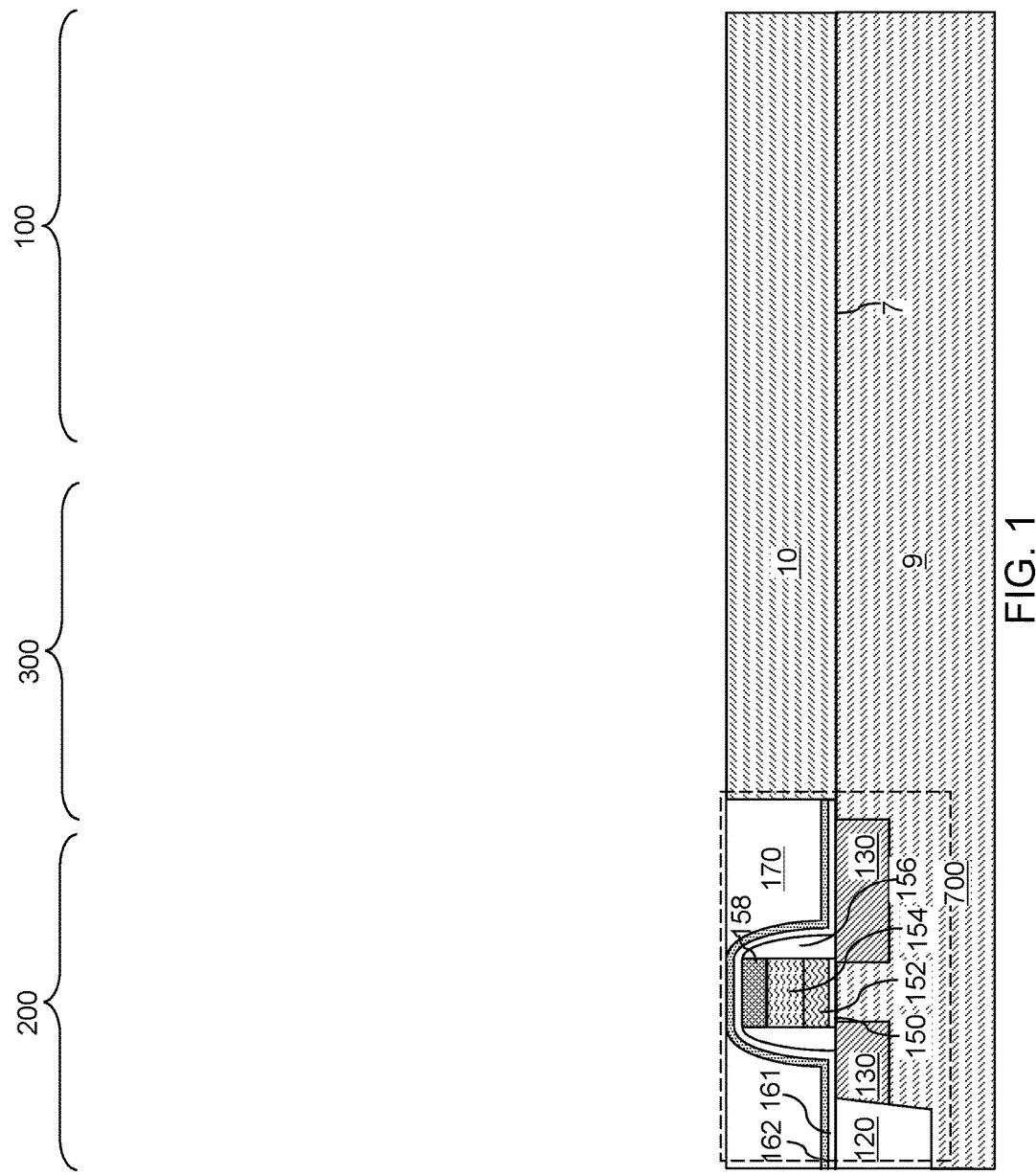
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device employing annular backside blocking dielectrics and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
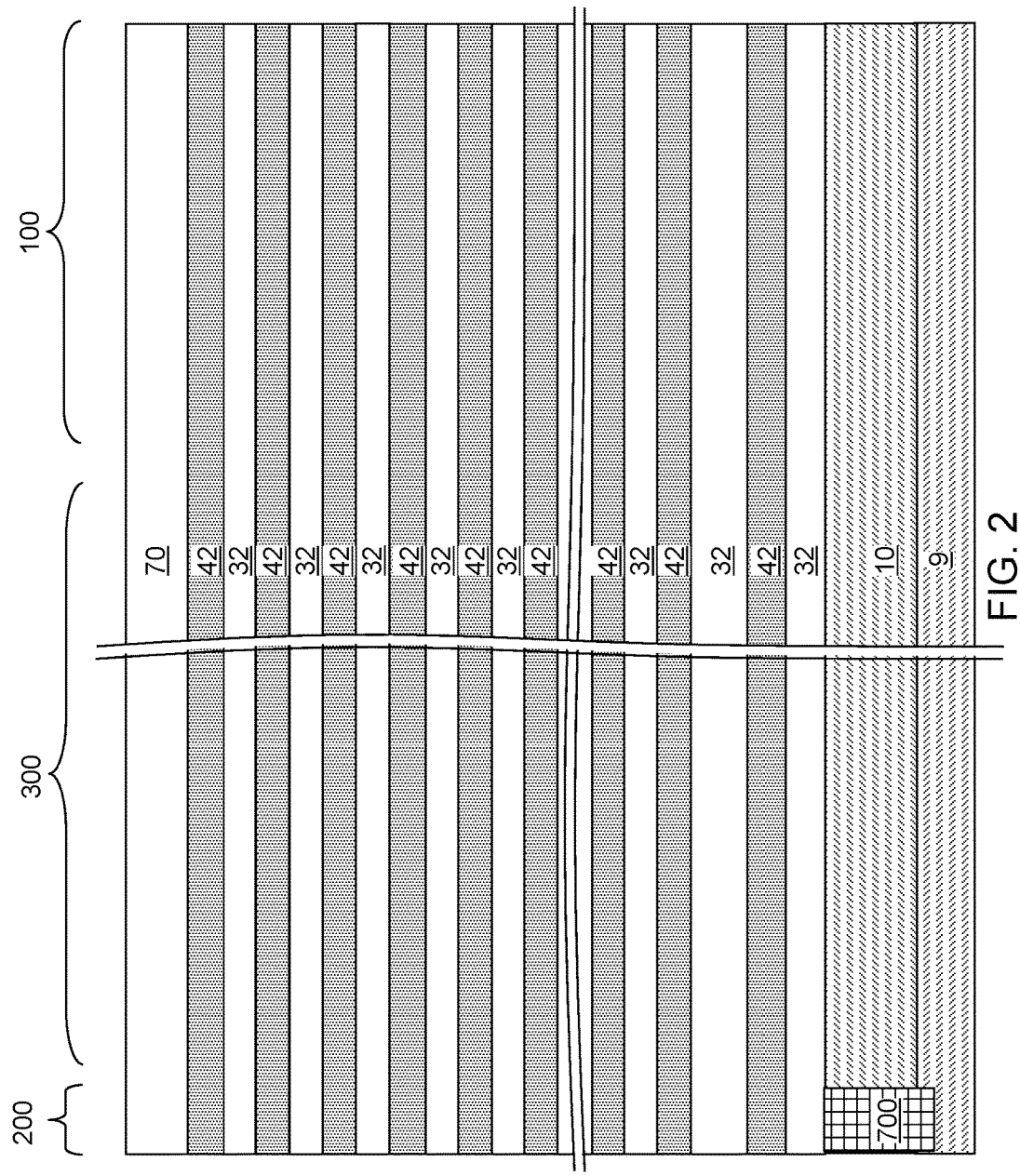
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
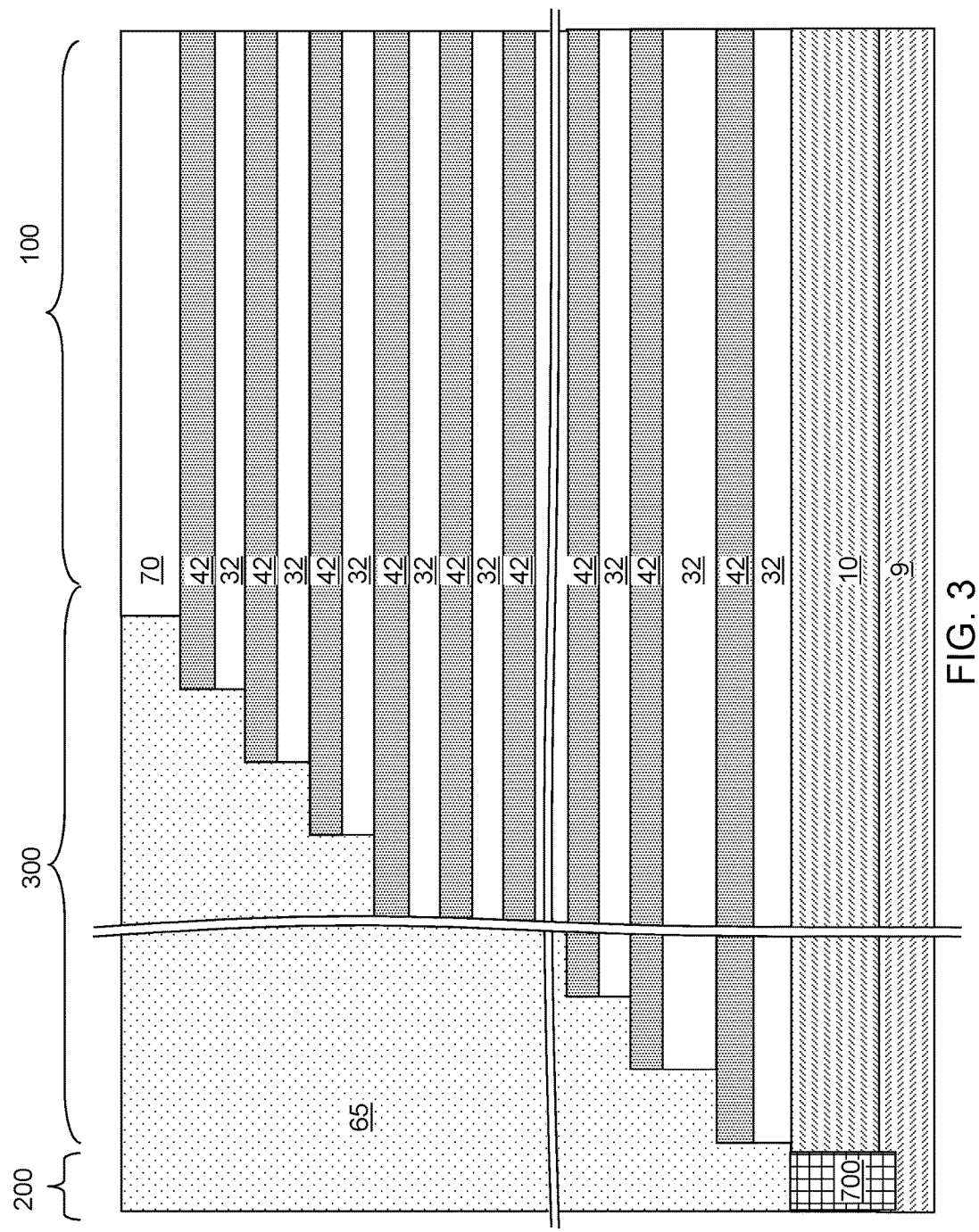
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures (not illustrated) can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
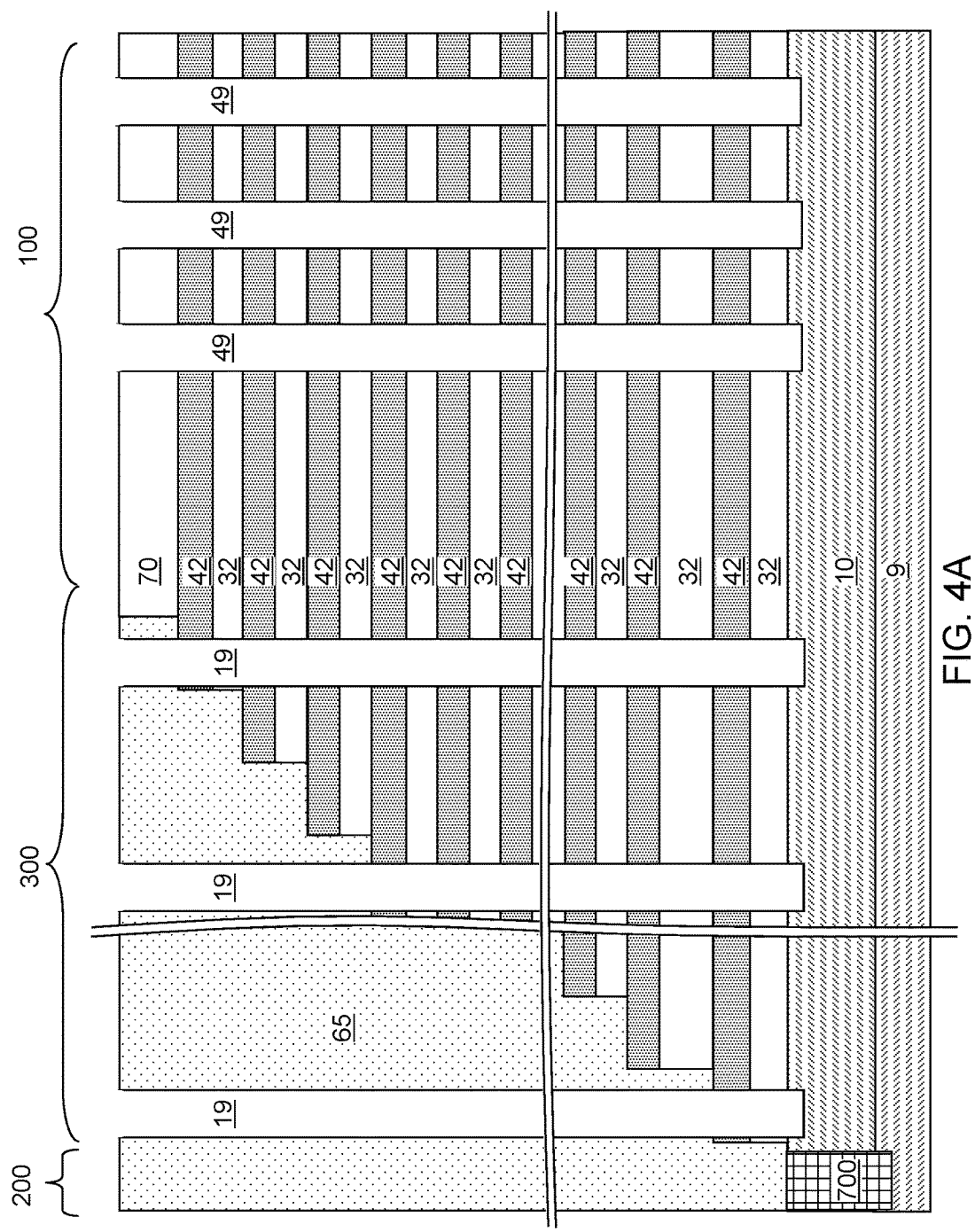
FIG. 4A is a schematic vertical cross-sectional view of the exemplary structure after formation of memory openings and support openings according to an embodiment of the present disclosure.
Figure 4B:
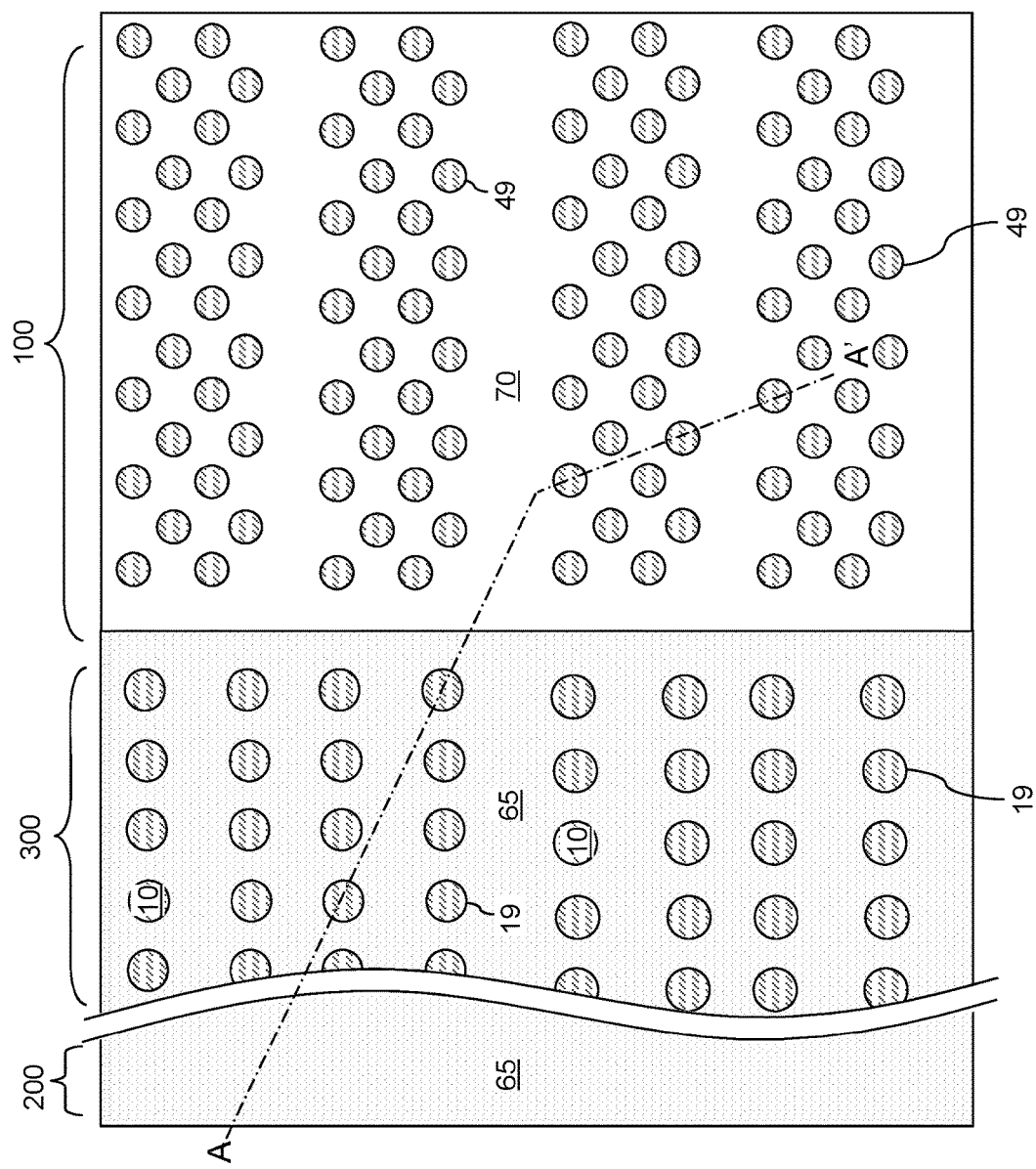
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5M illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

An oxidation process can be performed to convert a surface portion of the pedestal channel portion 11 into a semiconductor oxide portion, which is herein referred to as a sacrificial semiconductor oxide plate 13. The oxidation process can be a thermal oxidation process or a plasma oxidation process. For example, if the pedestal channel portion 11 includes silicon, the sacrificial semiconductor oxide plate 13 can include silicon oxide. The thickness of the pedestal channel portion 11 can be in a range from 1 nm to 10 nm, such as from 2 nm to 5 nm, although lesser and greater thicknesses can also be employed.

Figure 5C:
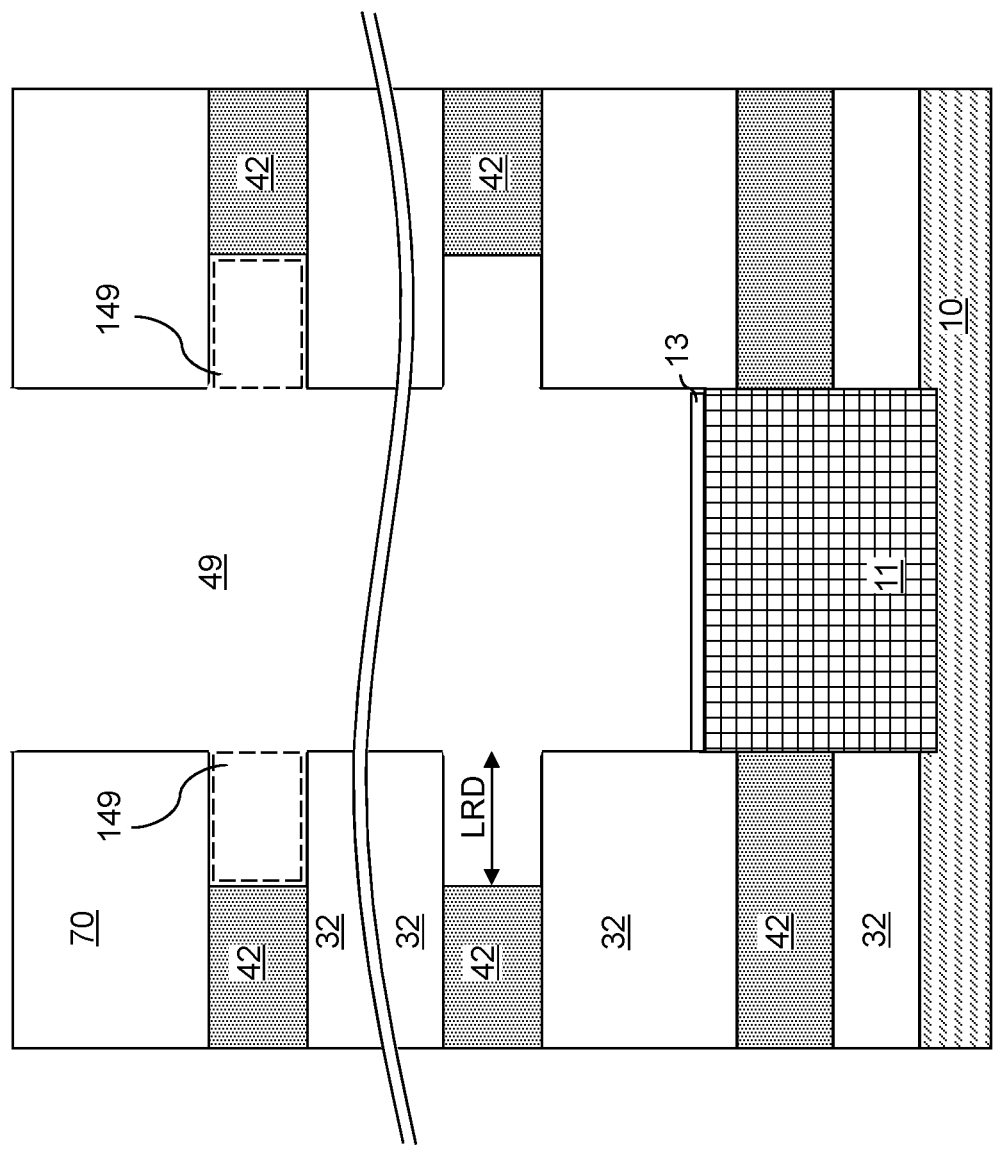

Referring to FIG. 5C, physically exposed sidewalls of the sacrificial material layers 42 can be laterally recessed from each memory opening 49 and from each support opening 19 by an isotropic etch process. An isotropic etch process such as a wet etch process can be employed to laterally recess the physically exposed sidewalls of the sacrificial material layers 42. For example, if the insulating layers 32, the insulating cap layer 70, and the retro-stepped dielectric material portion 65 includes silicon oxide and if the sacrificial material layers 42 include silicon nitride, a wet etch employing hot phosphoric acid may be employed to laterally recess the physically exposed sidewalls of the sacrificial material layers 42 relative to sidewalls of the insulating layers 32 and the insulating cap layer 70. An annular recess 149 can be formed at each level of the sacrificial material layers 42 around each memory opening 49 and a predominant subset of the support openings 19. The lateral recess distance LRD of the isotropic etch process is the lateral offset distance between a vertical plane including sidewalls of the insulating layers 32 and a vertical plane including laterally recessed sidewalls of the sacrificial material layers 42. The lateral recess distance LRD can be in a range from 10 nm to 120 nm, such as from 20 nm to 60 nm, although lesser and greater lateral recess distances LRD can also be employed.

Figure 5D:
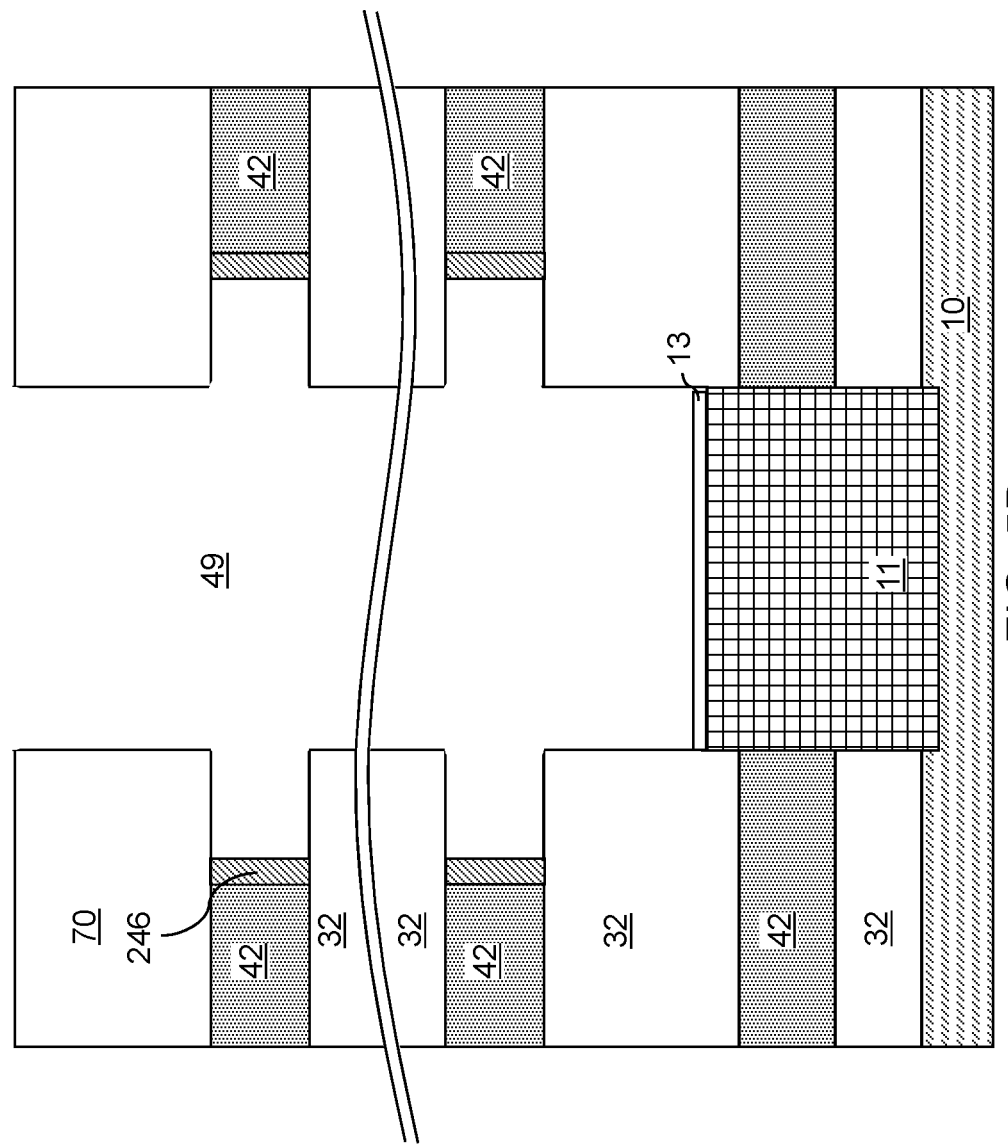

Referring to FIG. 5D, an annular semiconductor portion 246 can be optionally formed by selective deposition of a semiconductor material on each physically exposed sidewall of the sacrificial material layers 42 around each memory opening 49 and around each support opening 19. For example, the insulating layers 32, the insulating cap layer 70, and the retro-stepped dielectric material portion 65 can include silicon oxide, and the sacrificial material layers 42 can include silicon nitride. In this case, a semiconductor material such as silicon can be grown only from silicon nitride surfaces while preventing growth of silicon from silicon oxide surfaces. For example, disilane ($Si_2H_6$) can be employed as a reactant gas in a chemical vapor deposition process performed in a temperature range from 400 degrees Celsius to 600 degrees Celsius. An example of a selective silicon deposition process is provided in S. Yokoyama et al., "Low-temperature selective deposition of silicon on silicon nitride by time-modulated disilane flow and formation of silicon narrow wires," Applied Physics Letters, Vol. 79, No. 4 pp. 494-496 (2001). Generally, the annular semiconductor portions 246 can include silicon, germanium, or a silicon-germanium alloy. If incorporation of germanium is desired, a germanium-containing precursor such as digermane ($Ge_2H_6$) can be employed in addition to, or instead of, disilane.

In one embodiment, the annular semiconductor portions 246 can be sacrificial structures that are removed prior to formation of electrically conductive layers. In this case, the annular semiconductor portions 246 need not be doped with electrical dopants. If germanium is employed for the annular semiconductor portions 246, the germanium concentration in the annular semiconductor portions 246 can be in a range from 1% to 100%, such as from 30% to 100%, in atomic concentration.

In another embodiment, the annular semiconductor portions 246 may not be formed. If present, the annular semiconductor portions 246 can be employed to facilitate selective deposition of a metal in a subsequent processing step, and to broaden the selection for an elemental metal that can be selectively deposited in the annular recesses 149. The lateral thickness of each annular semiconductor portion 246, if employed, is less than the lateral recess distances LRD, and can be in a range from 1 nm to 10 nm as measured between an outer cylindrical sidewall and an inner cylindrical sidewall, although lesser and greater lateral thicknesses can also be employed.

Figure 5E:
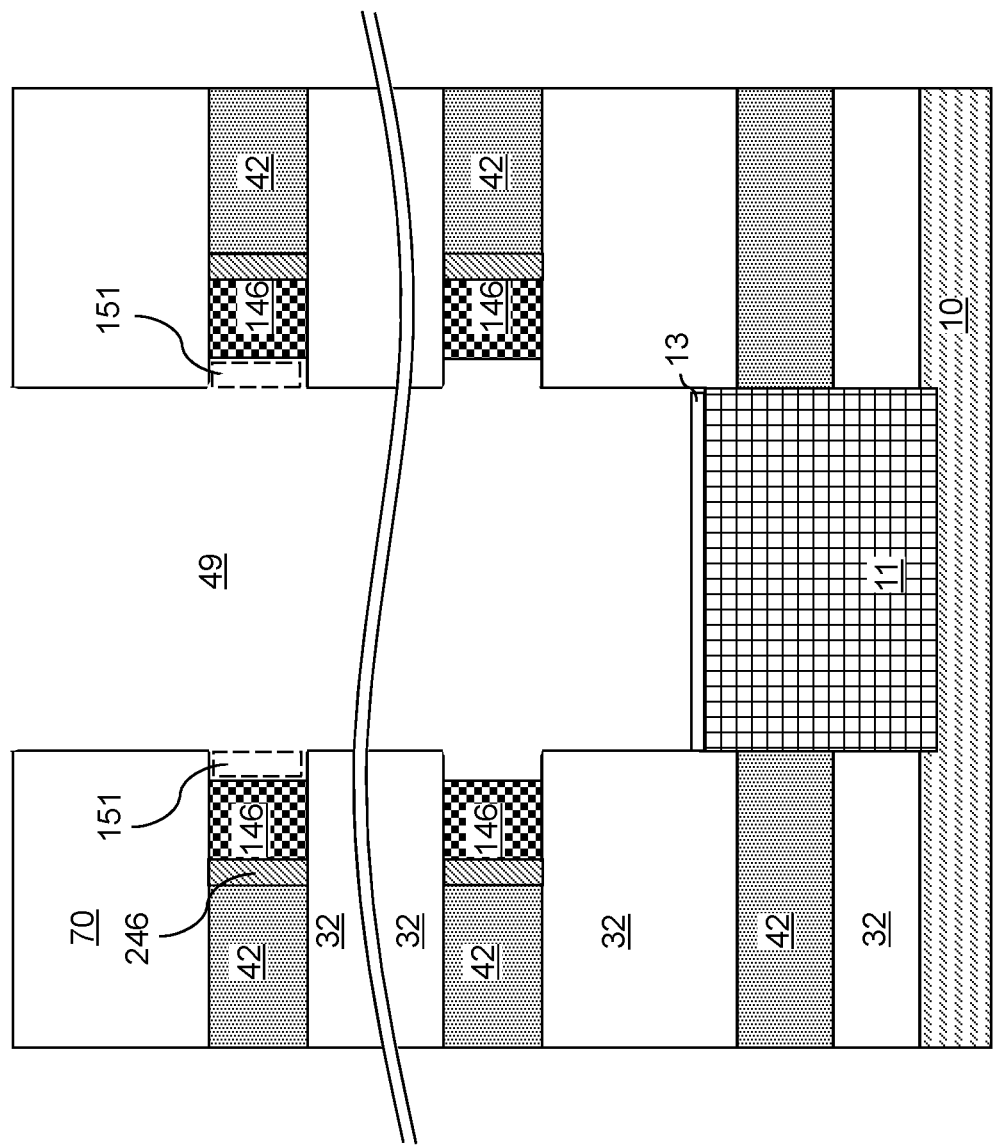

Referring to FIG. 5E, annular metal portions 146 can be formed over the recessed sidewalls of the sacrificial material layers 42. The annular metal portions 146 can be formed on the inner cylindrical sidewalls of the annular semiconductor portions 246, or on the recessed sidewalls of the sacrificial material layers 42 in case the annular semiconductor portions 246 are not employed.

In one embodiment, the annular semiconductor portions 246 are not employed, and the annular metal portions 146 are formed on the recessed sidewalls of the sacrificial material layers 42. In this case, the material of the annular metal portions 146 is selected from metallic materials that can grow directly from the surfaces of the sacrificial material layers 42 without growing from surfaces of the insulating layers 32 and the insulating cap layer 70. For example, if the insulating layers 32 and the insulating cap layer 70 include silicon oxide and if the sacrificial material layers 42 include silicon nitride, ruthenium can be grown only from the recessed sidewalls of the sacrificial material layers 42 without growth from surfaces of the insulating layers 32 and the insulating cap layer 70 by a selective ruthenium deposition process. The selective ruthenium deposition process can be an atomic layer deposition process employing $RuO_4$ as a ruthenium precursor gas and hydrogen or a hydride gas as a reducing agent. During the atomic layer deposition process, the $RuO_4$ gas nucleates as $RuO_2$ on silicon nitride surfaces or ruthenium surfaces without nucleating on silicon oxide surfaces. Each monolayer of $RuO_2$ can be reduced into a ruthenium monolayer during a subsequent reduction step. Alternate repetition of a $RuO_2$ monolayer deposition step and a reduction step can grow ruthenium only from the silicon nitride surfaces without inducing growth of ruthenium from silicon oxide surfaces.

In another embodiment, the annular semiconductor portions 246 are employed, and the annular metal portions 146 are selectively formed on the inner cylindrical sidewalls of the annular semiconductor portions 246. In this case, the material of the annular metal portions 146 is selected from metallic materials that can grow directly from the surfaces of the annular semiconductor portions 246 without growing from surfaces of the insulating layers 32 and the insulating cap layer 70. For example, if the insulating layers 32 and the insulating cap layer 70 include silicon oxide and if the annular semiconductor portions 246 include doped silicon or undoped silicon, molybdenum can be grown only from the inner cylindrical sidewalls of the annular semiconductor portions 246 without growth from surfaces of the insulating layers 32 and the insulating cap layer 70 by a selective molybdenum deposition process. The selective molybdenum deposition process can be an atomic layer deposition process or chemical vapor deposition process employing $MoF_6$ as a molybdenum precursor gas and hydrogen or a hydride gas as a reducing agent. Optionally, additional gas such as $SiH_4$ or $SiH_4$ may be employed to enhance selectivity of the chemical vapor deposition process. An exemplary chemical vapor deposition process that grows molybdenum only from silicon surfaces without growing molybdenum from silicon oxide surfaces is described in A. Harsta and J. Carlsson, "Thermodynamic Investigation of Selective Molybdenum Chemical Vapour Deposition: Influence of Growth Conditions and Gas Additives on the Selectivity of the Process," Thin Solid Films, 185 (1900), 255-246.

Generally, the annular metal portions 146 can be formed over the recessed sidewalls of the sacrificial material layers 42 within each of the annular recesses 149. The annular metal portions 146 can be formed by a selective metal deposition process that grows a metal of the annular metal portions 146 over recessed sidewalls of the sacrificial material layers 42 without growing the metal from surfaces of the insulating layers 32. In some embodiments, the metal of the annular metal portions 146 can be selected from ruthenium and molybdenum.

The lateral thickness of the annular metal portions 146, as measured between an outer cylindrical sidewall and an inner cylindrical sidewall, can be in a range from 10 nm to 110 nm, such as from 20 nm to 55 nm, although lesser and greater lateral thicknesses can also be employed. The lateral thickness of the annular metal portions can be the same as, less than or greater than the lateral recess distances LRD. If the annular semiconductor portions 246 are present, then the sum of the lateral thickness of the adjacent annular semiconductor portions 246 and the annular metal portions 146 can be the same as, less than or greater than the lateral recess distances LRD. In case the inner cylindrical sidewalls of the annular metal portions 146 are laterally recessed outward from a vertical surface including the sidewalls of the insulating layers 32, a recessed region 151 can be provided at each level of the annular metal portions 146 around each memory opening 49 and around a predominant subset of the support openings 19.

Figure 5F:
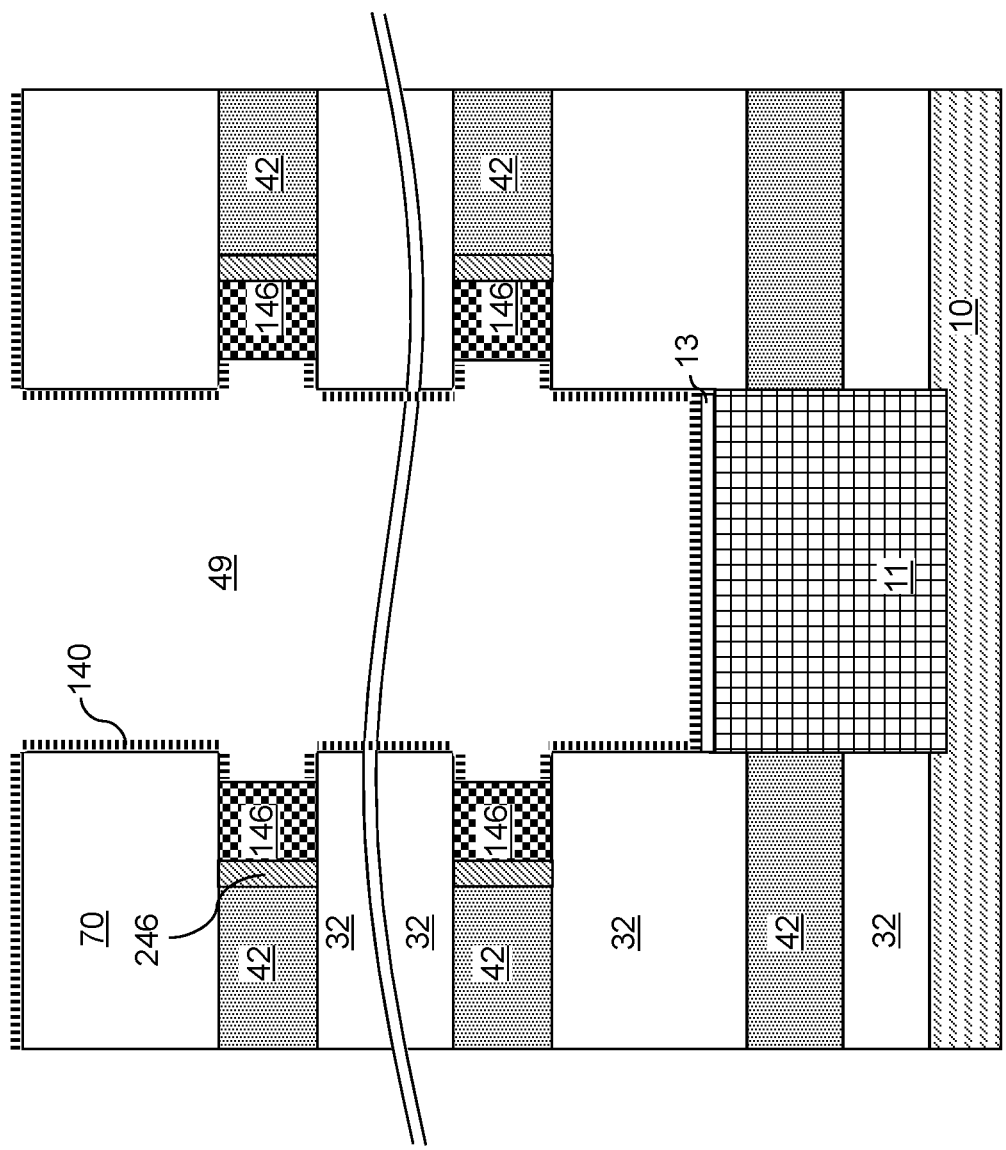

Referring to FIG. 5F, a self-assembled monolayer 140 including a self-assembly material is coated on surfaces of the insulating layers 32, the insulating cap layer 70, and the sacrificial semiconductor oxide plate 13 within each memory opening 49 and within each support opening 19. The self-assembly material is selected such that the self-assembly material coats only physically exposed surfaces of the insulating layers 32, the insulating cap layer 70, and the sacrificial semiconductor oxide plate 13 with a monolayer of the self-assembly material without coating surfaces of the annular metal portions 146. The self-assembly material adheres to the physically exposed surfaces of the insulating layers 32, the insulating cap layer 70, and the sacrificial semiconductor oxide plate 13 without adhering to physically exposed surfaces of the annular metal portions 146. The self-assembly material subsequently inhibits nucleation of a dielectric material of annular backside blocking dielectrics during a subsequent selective dielectric material deposition process.

The self-assembly material that forms the self-assembled monolayer 140 adheres only to a particular type of surface without adhering to other types of surfaces, and alters the reactivity between an atomic layer deposition (ALD) precursor for the particular type of surface. For example, the reactivity of a surface coated with the self-assembled monolayer 140 can be suppressed relative to a surface that is not coated with the self-assembled monolayer 140. In case the insulating layers 32, the insulating cap layer 70, and the sacrificial semiconductor oxide plate 13 include silicon oxide, the self-assembled monolayer 140 can prevent deposition of a dielectric oxide material in a subsequent atomic layer deposition, while the dielectric oxide material grows from surfaces of the annular metal portions 146 that are not coated with the self-assembly material. Thus, the physically exposed surfaces of the insulating layers 32 are selectively coated with a monolayer of the self-assembly material that adheres to the physically exposed surfaces of the insulating layers 32 without adhering to physically exposed surfaces of the annular metal portions 146.

In one embodiment, the self-assembly material that forms the self-assembled monolayer 140 can be selected from alaknethiols, oligophenolylenes, oligo(phenoleneethynylenes), and oligo(phenylenevinylenes). Exemplary species of the self-assembly material that forms the self-assembled monolayer 140 include octyltrichlorosilane, octadecyltrichlorosilane, hexamethyldisilane. Properties of such self-assembly materials are discussed in the Ph.D. thesis of Guo Le, "Selective Chemistry of Metal Oxide Atomic Layer Deposition on Si Based Substrate Surfaces", U.C. Riverside Electronic Theses and Dissertations (2015) (available online at https://escholarship.org/uc/item/55t058st), incorporated herein by reference in its entirety.

Figure 5G:
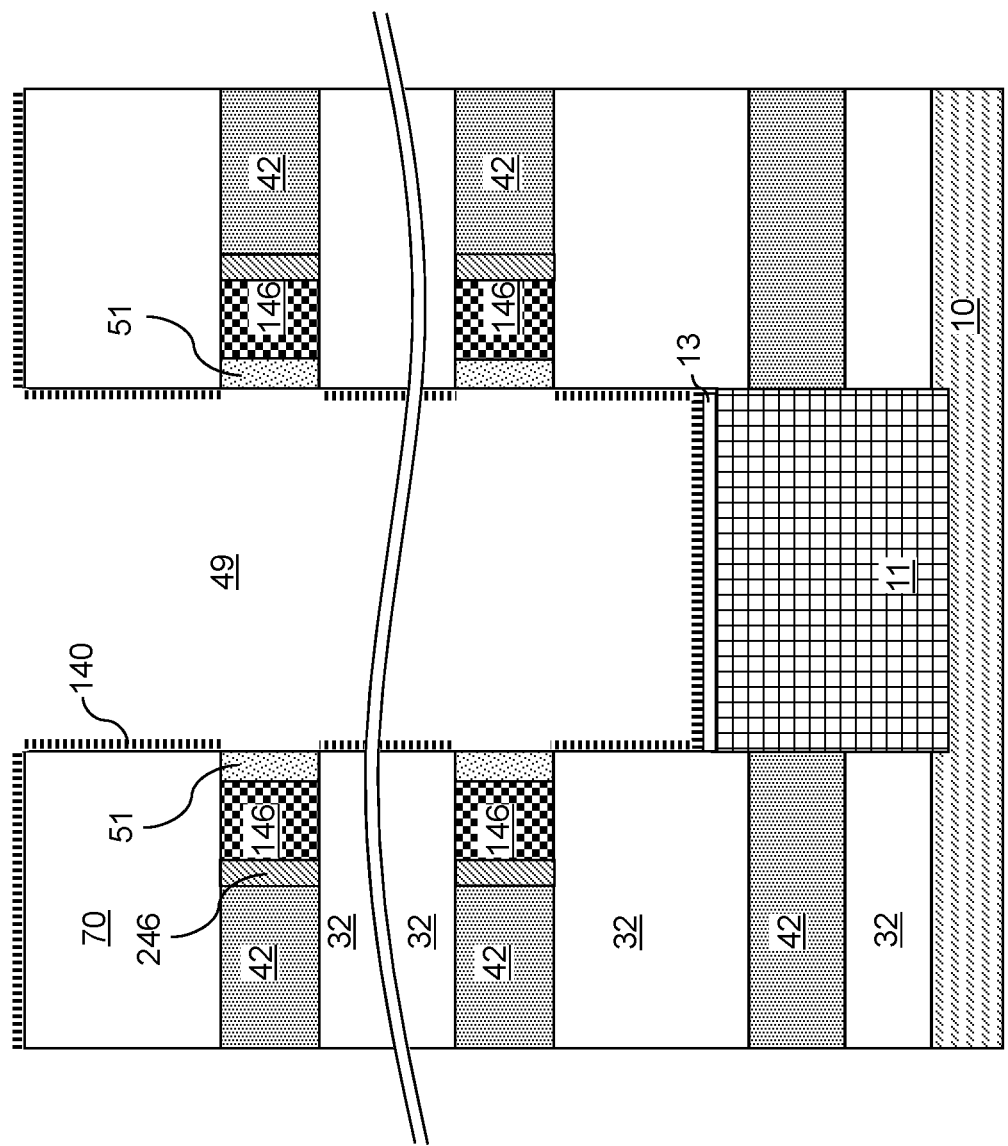

Referring to FIG. 5G, a selective dielectric material deposition process is performed to grow a dielectric material from surfaces of the annular metal portions 146 without inducing growth of the dielectric material from surfaces that are coated with the self-assembled monolayer 140. The self-assembly material of the self-assembled monolayer 140 inhibits nucleation of the dielectric material while growth of the dielectric material proceeds from the physically exposed surfaces (i.e., the inner cylindrical sidewalls) of the annular metal portions 146 during the selective dielectric material deposition process. Thus, the selective dielectric material deposition process grows the dielectric material from the physically exposed surfaces of the annular metal portions without growing the dielectric material from surfaces of the insulating layers 32 that are covered with the self-assembled monolayer 140. The deposited dielectric material forms annular backside blocking dielectrics 51 that are located on inner sidewalls of the annular metal portions 146.

In one embodiment, the deposited dielectric material can be a dielectric metal oxide such as aluminum oxide. In this case, the annular backside blocking dielectrics 51 can be annular dielectric metal oxide portions. The lateral thickness of each annular backside blocking dielectric 51, as measured between an outer cylindrical sidewall and an inner cylindrical sidewall, can be in a range from 1 nm to 20 nm, such as from 2 nm to 10 nm, although lesser and greater lateral thicknesses can also be employed. The inner cylindrical sidewalls of the annular backside blocking dielectrics 51 may be vertically coincident with sidewalls of the insulating layers 32, may be recessed outward from a vertical surface including the sidewalls of the insulating layers 32, or may protrude inward from the vertical surface including the sidewalls of the insulating layers 32. As used herein, a first surface is vertically coincident with a second surface if the second surface overlies or underlies the first surface and if there exists a vertical plane including the first surface and the second surface.

Subsequently, the self-assembled monolayer 140 can be removed selective to the insulating layers 32 and the annular backside blocking dielectrics 51. An isotropic etch process, dissolution in a solvent, evaporation, or ashing may be employed to remove the self-assembled monolayer 140. The sacrificial semiconductor oxide plate 13 can be removed from within each memory opening 49 and each support opening 19 by an anisotropic etch that etches silicon oxide selective to the semiconductor material of the pedestal channel portion 11. Alternatively, an isotropic etch such as a wet etch employing dilute hydrofluoric acid may be employed to remove the sacrificial semiconductor oxide plate 13 from within each memory opening 49 and support opening 19.

Figure 5H:
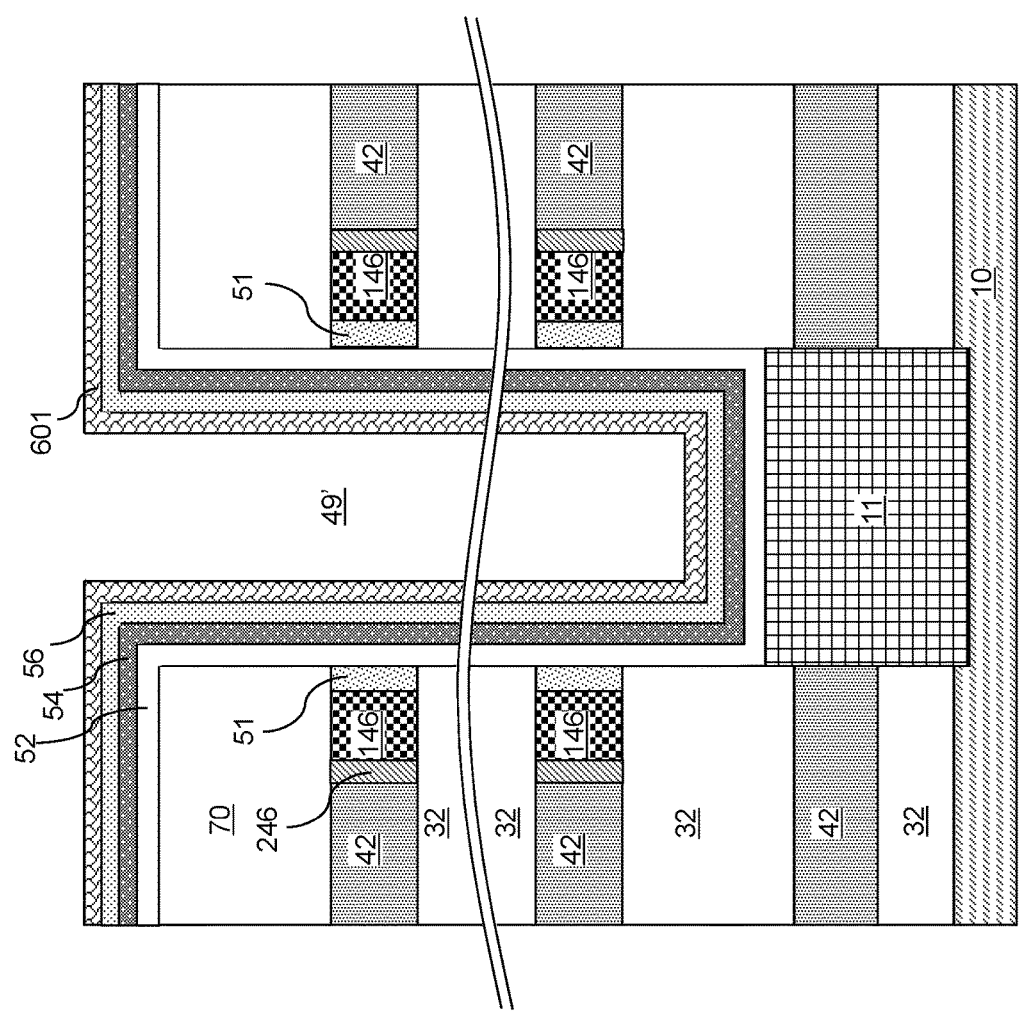

Referring to FIG. 5H, a stack of layers including a blocking dielectric layer 52, a charge storage layer 54, a tunneling dielectric layer 56, and an optional first semiconductor channel layer 601 can be sequentially deposited in the memory openings 49. The blocking dielectric layer 52 can be a front side blocking dielectric which is formed on sidewalls of the annular backside blocking dielectrics 51 and on sidewalls of the insulating layers 32.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($La_2O_3$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Figure 5I:
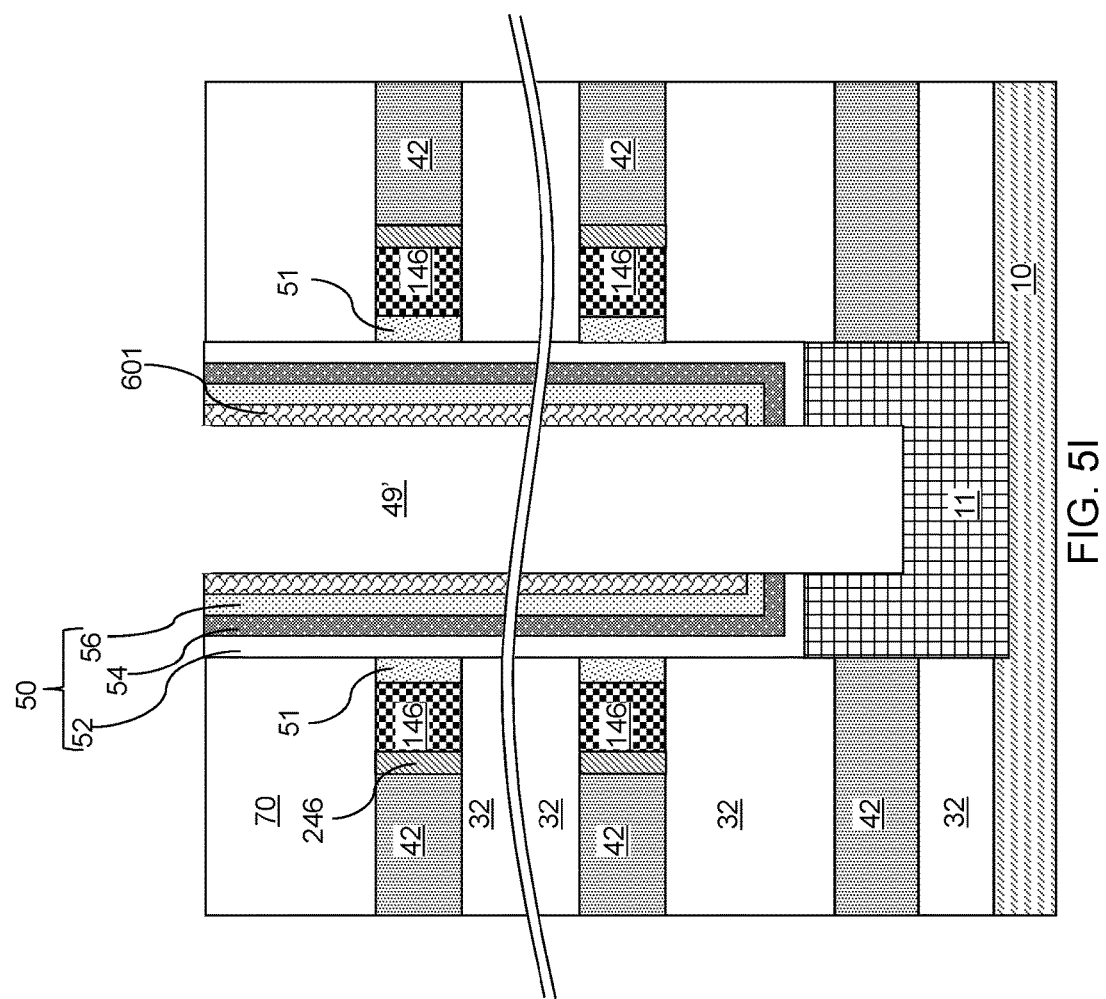

Referring to FIG. 5I, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5J:
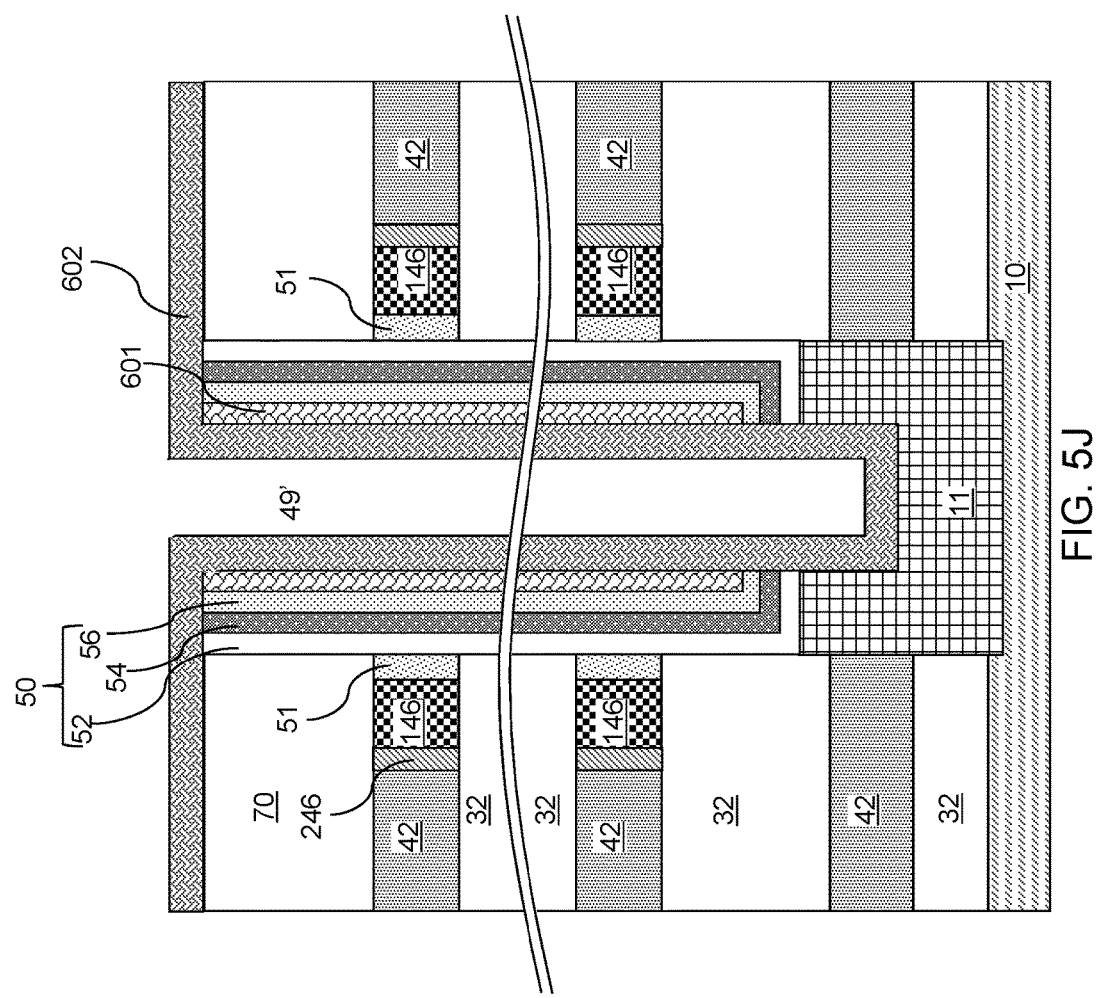

Referring to FIG. 5J, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5K:
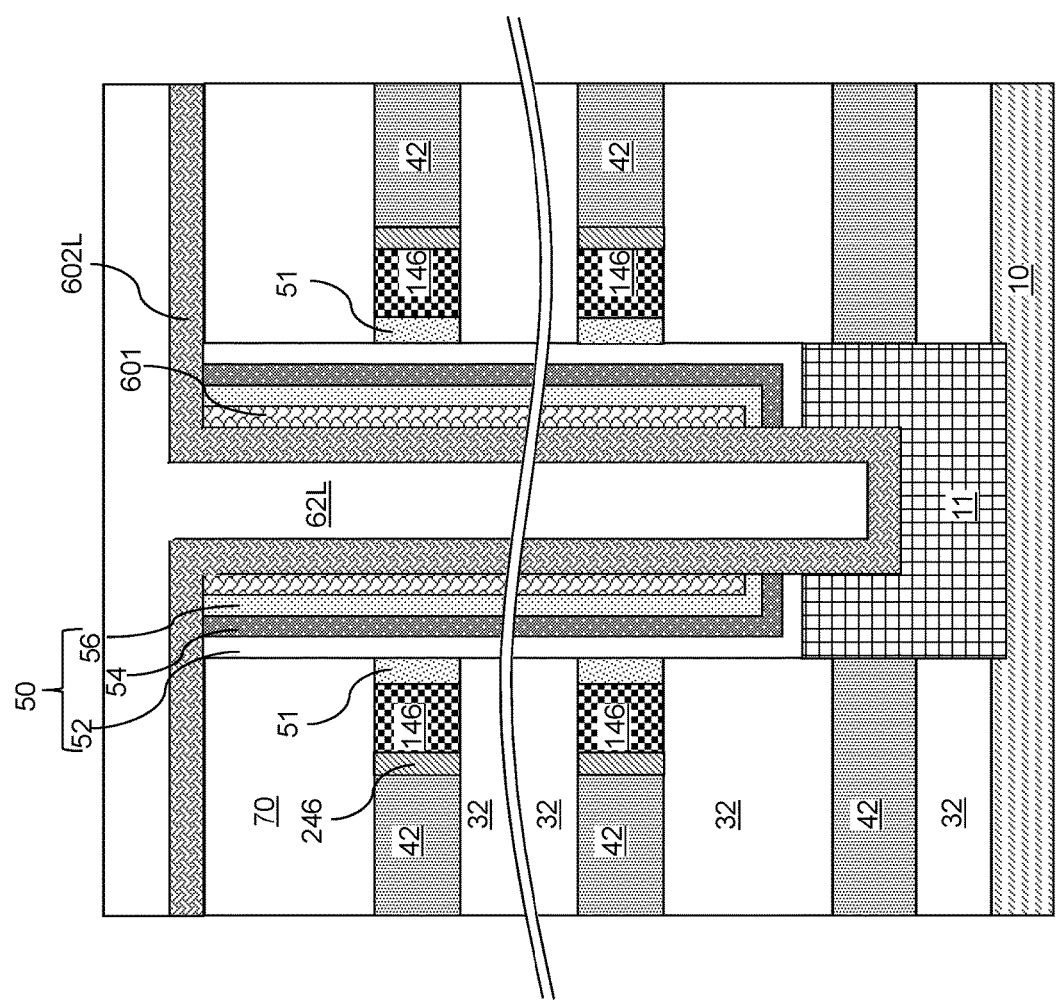

Referring to FIG. 5K, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5L:
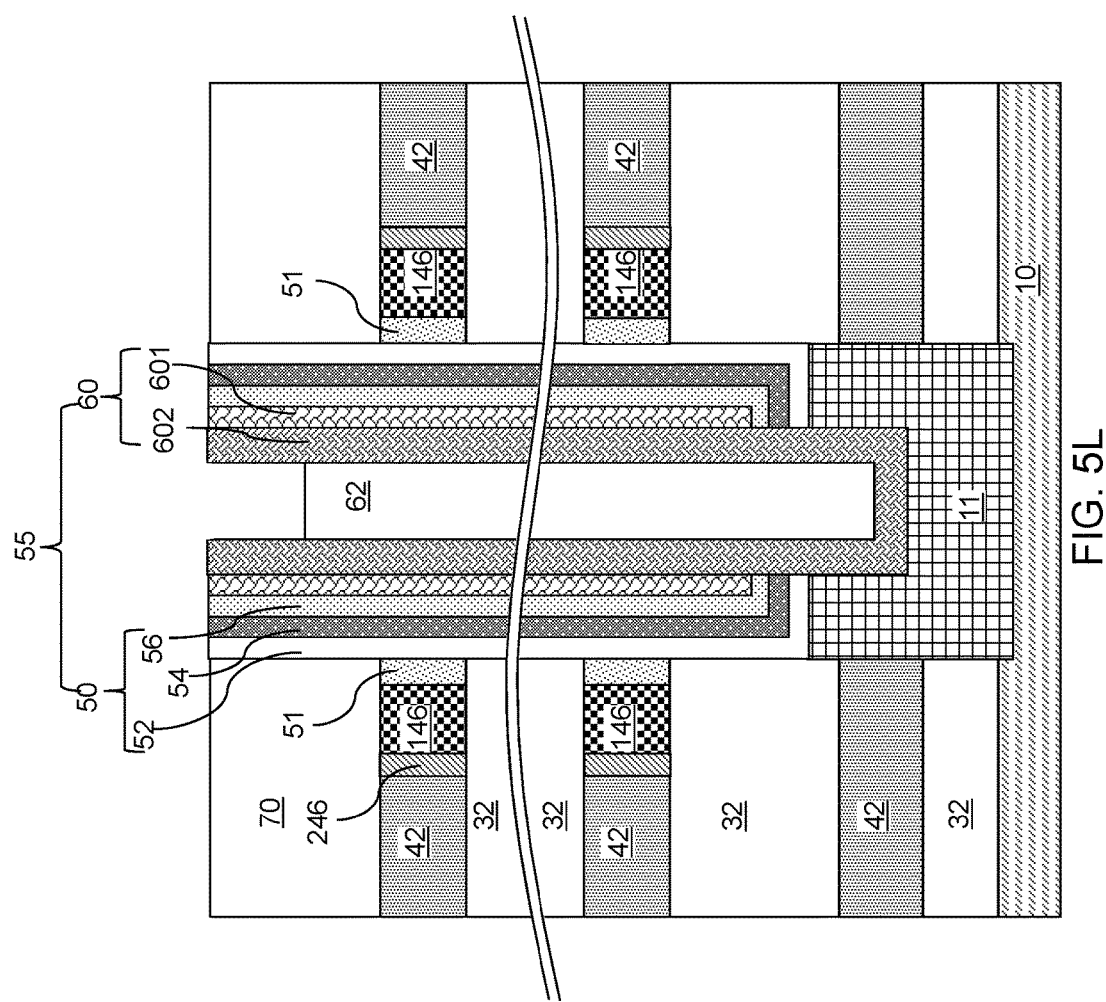

Referring to FIG. 5L, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5M:
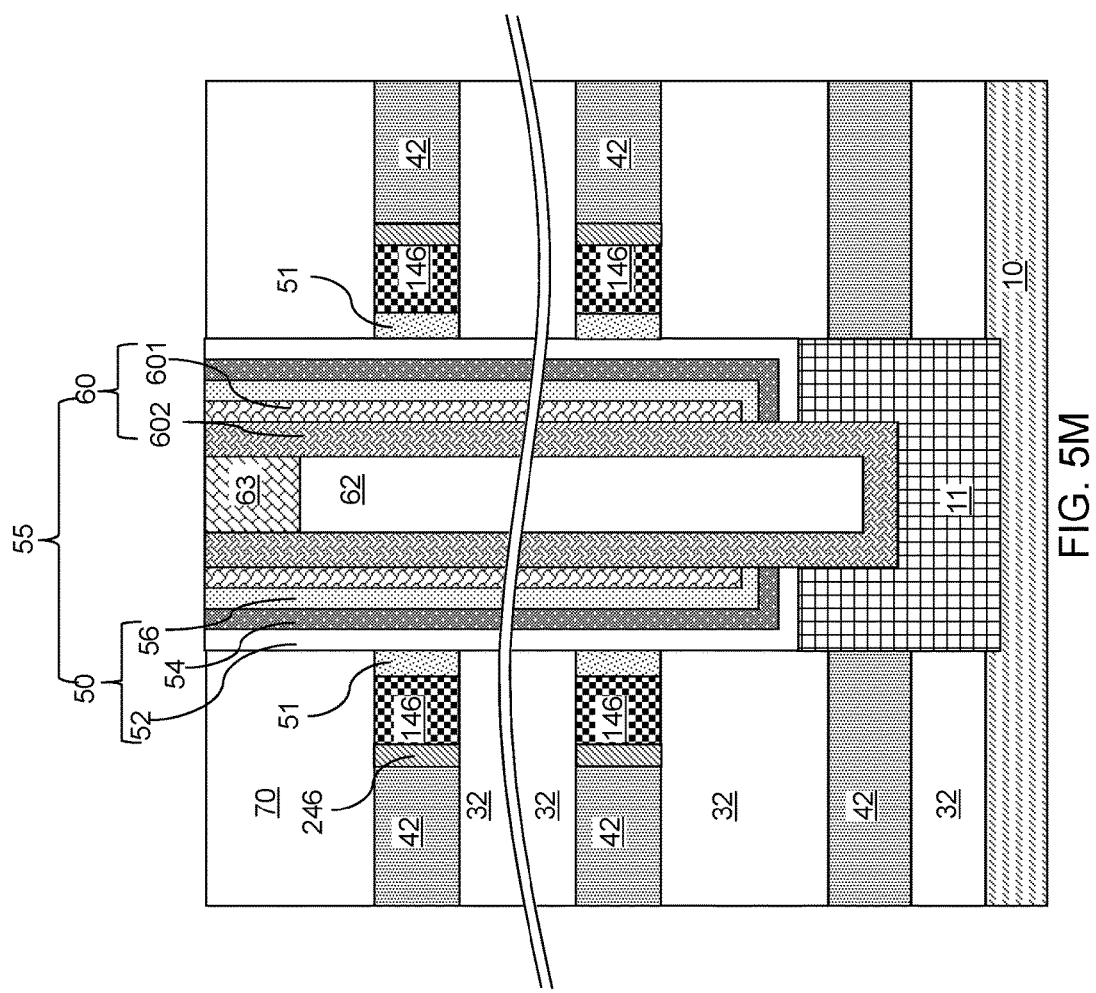

Referring to FIG. 5M, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20 shown in FIG. 6.

Figure 6:
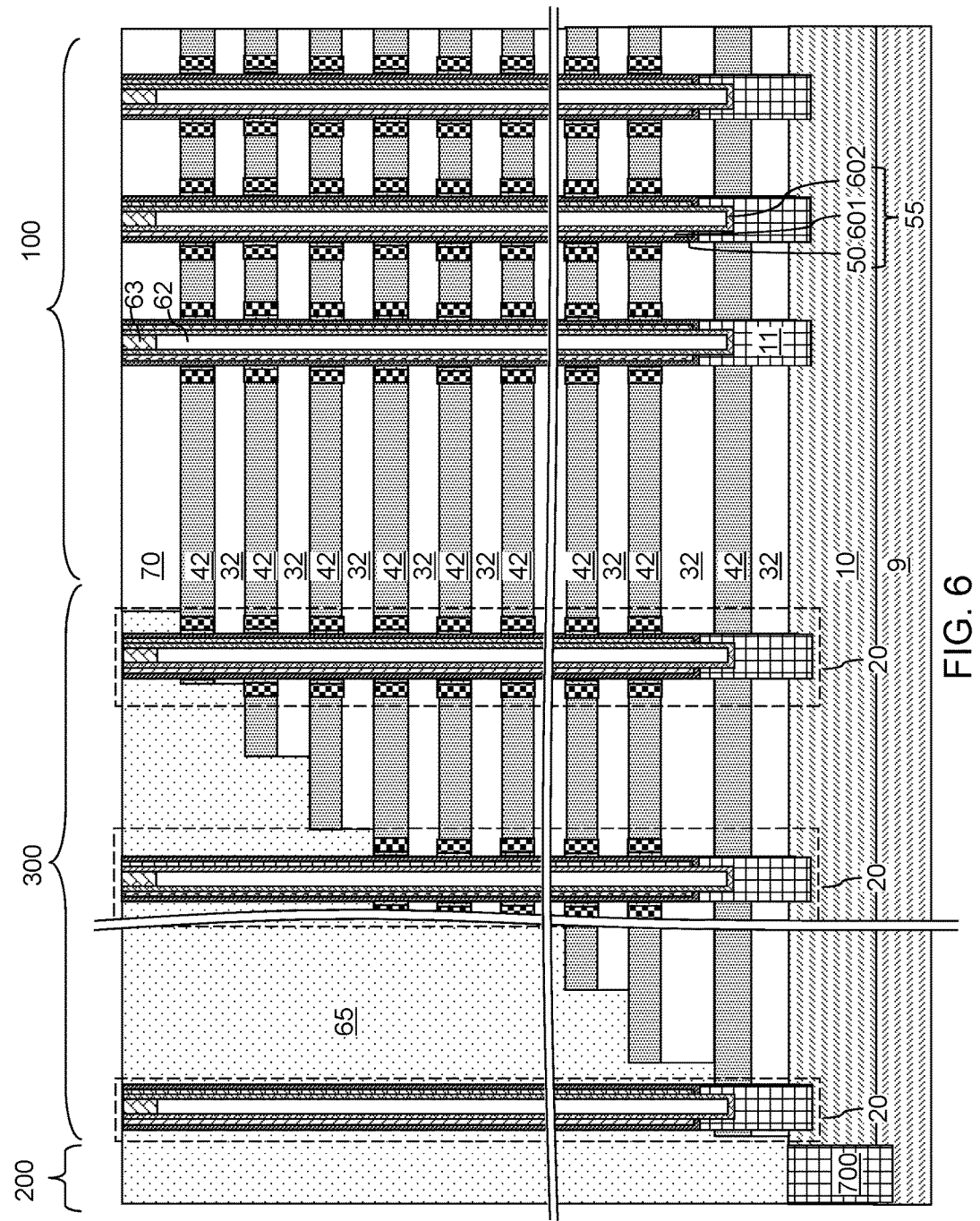
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
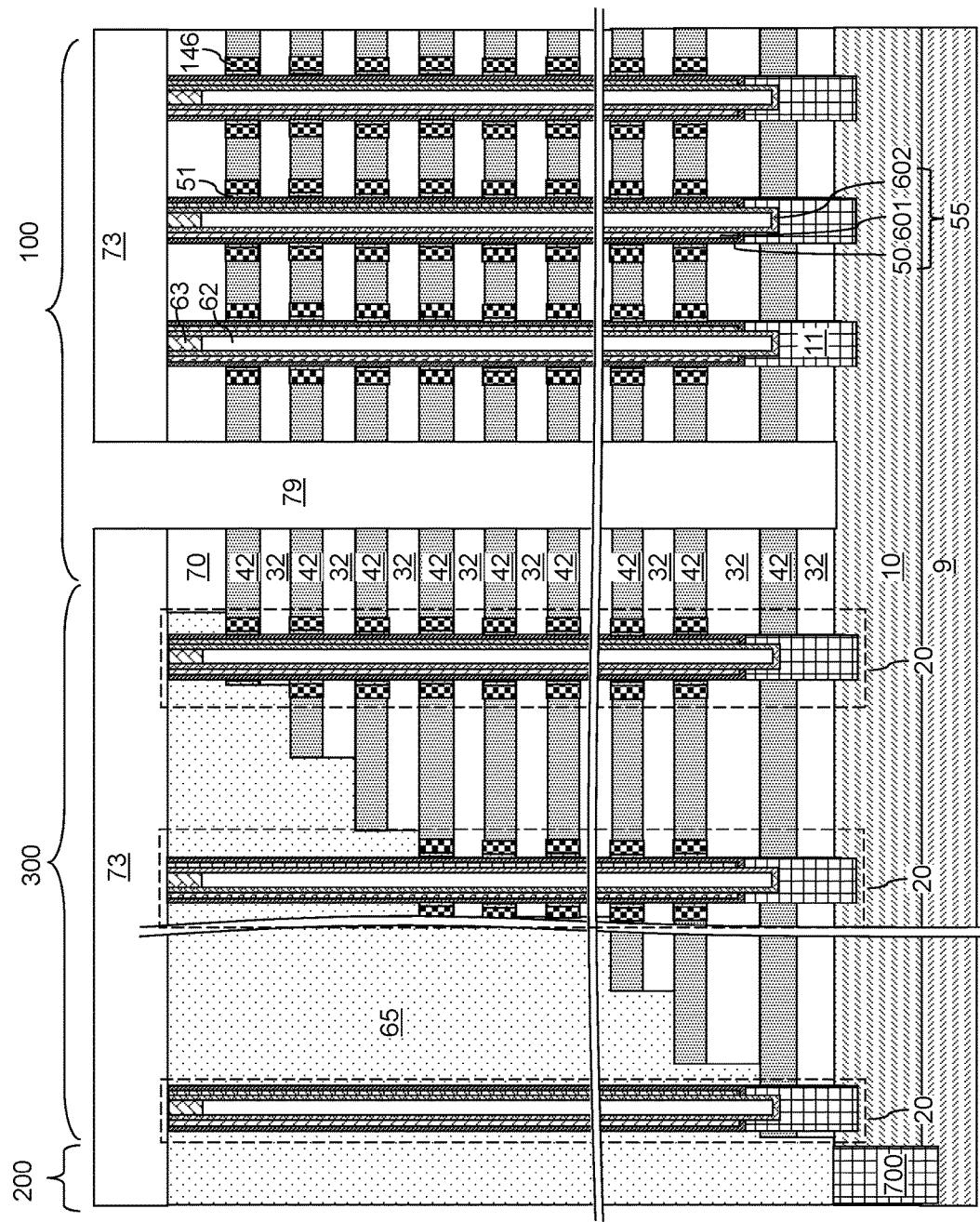
FIG. 7A is a schematic vertical cross-sectional view of the exemplary structure after formation of backside trenches according to an embodiment of the present disclosure.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 8:
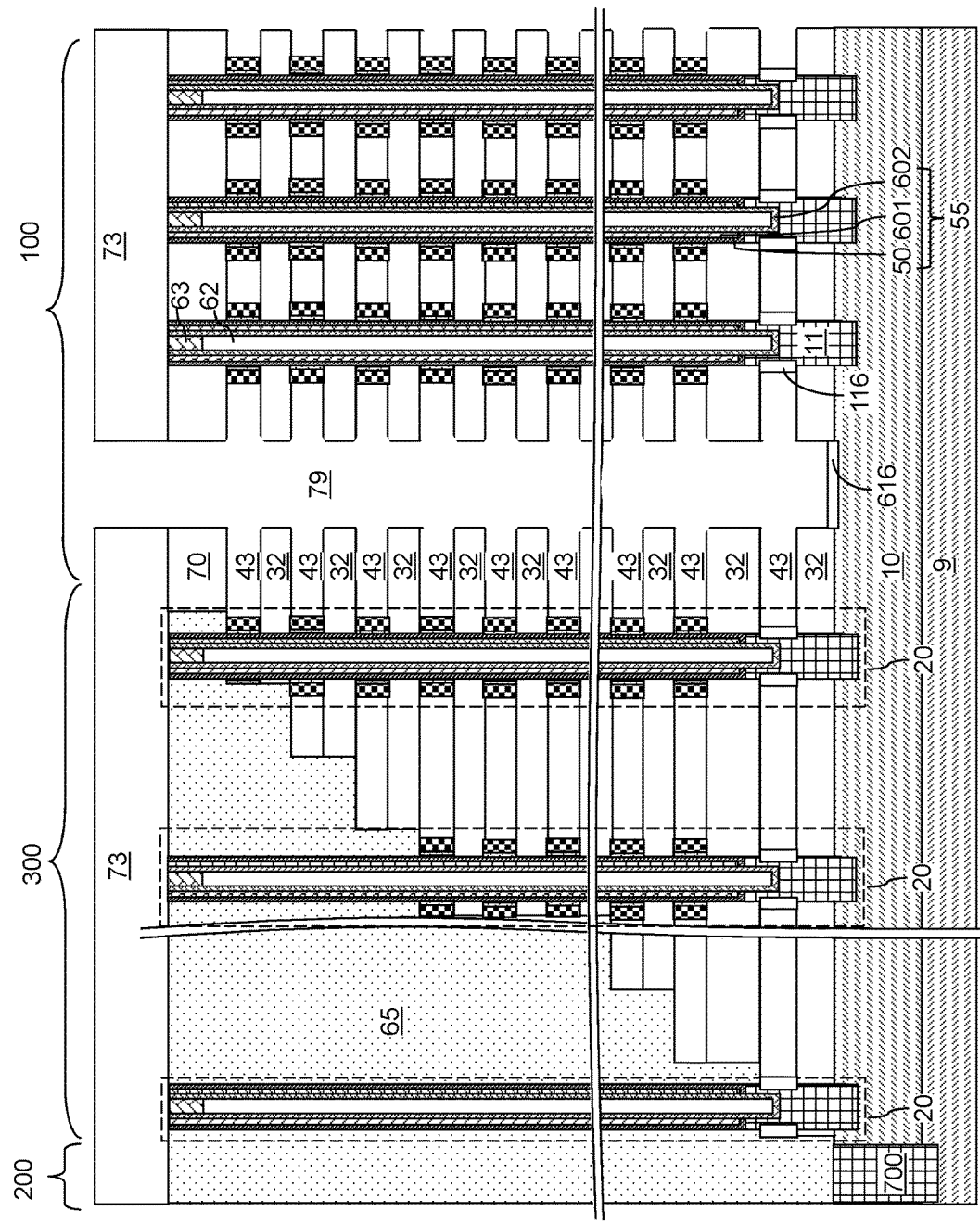
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. If annular semiconductor portions 246 are present, then the annular semiconductor portions 246 can be removed selective to the annular metal portions 146 by an isotropic etch that is selective to the insulating layers 32. For example, if the annular semiconductor portions 246 comprise silicon, then a wet etch process including KOH or trimethyl-2 hydroxyethyl ammonium hydroxide (often called TMY or TMAH) can be employed to remove the annular semiconductor portions 246 selective to the annular metal portions 146 and the insulating layers 32. If the annular semiconductor portions 246 include germanium or a silicon-germanium alloy with atomic concentration of germanium greater than 30%, a wet etch process including hydrogen peroxide and optionally phosphoric acid can be employed to remove the annular semiconductor portions 246 selective to the annular metal portions 146 and the insulating layers 32. FIG. 9A illustrates a region of the exemplary structure of FIG. 8 after removal of the sacrificial material layers 42 and, if present, the annular semiconductor portions 246.

Backside recesses 43 are formed in volumes from which the sacrificial material layers 42 and the annular semiconductor portions 246 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN. A backside cavity 79' is present within the backside trench 79.

Figure 10A:
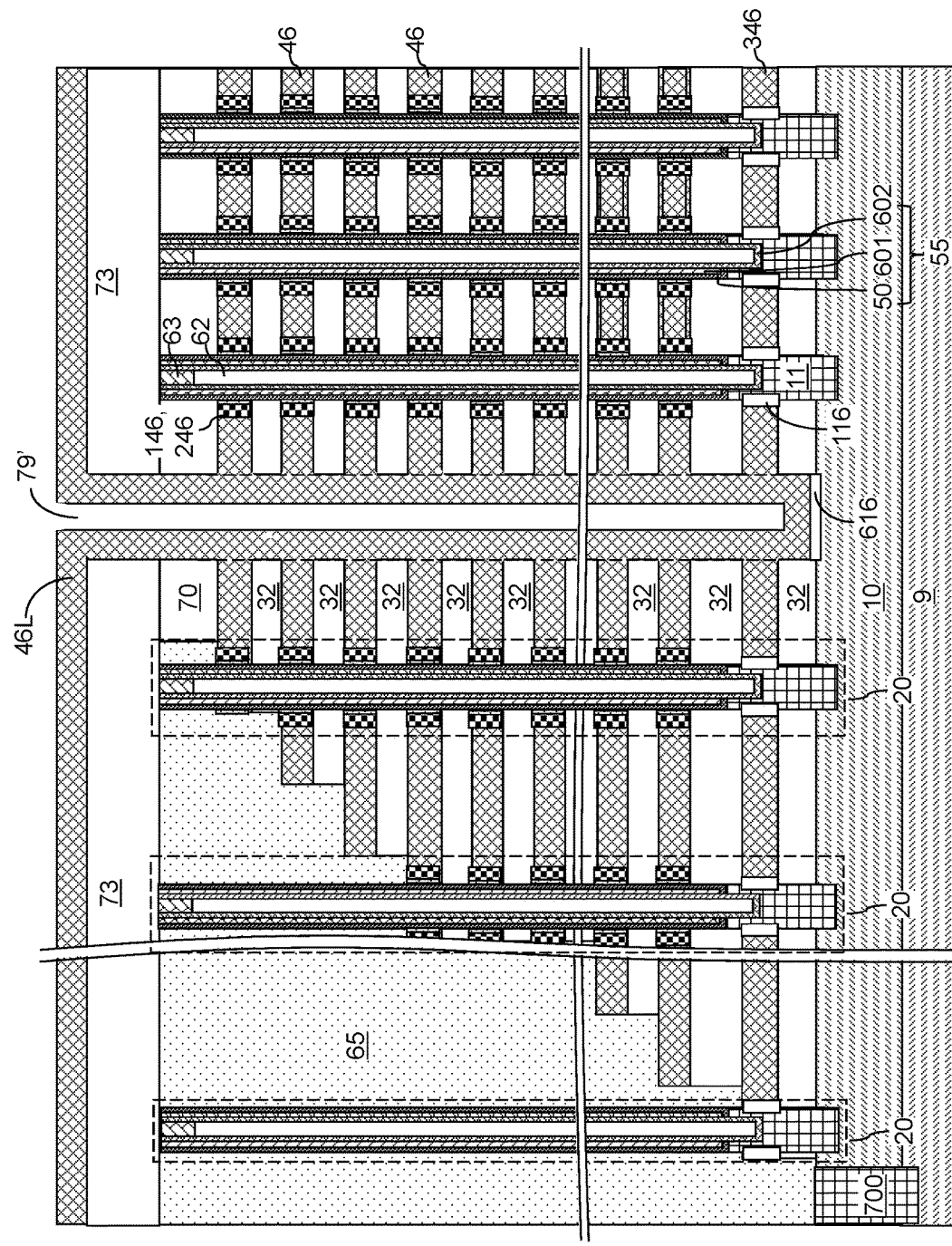
FIG. 10A is a schematic vertical cross-sectional view of the exemplary structure after formation of electrically conductive layers according to an embodiment of the present disclosure.
Figure 10B:
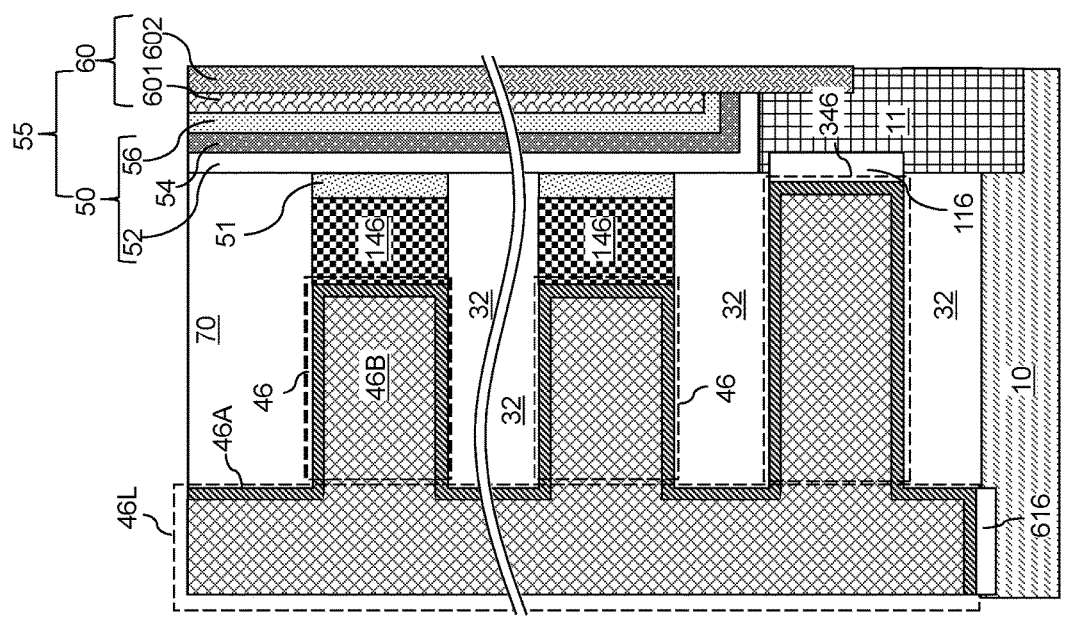
FIG. 10B is a vertical cross-sectional view of a region of the exemplary structure of FIG. 10A.

Referring to FIGS. 10A and 10B, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers (46, 346) can be formed in the plurality of backside recesses 43, and a continuous metallic material layer 46L can be formed on the sidewalls of each backside trench 79 and over the contact level dielectric layer 73. Each electrically conductive layer (46, 346) includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73. One or more bottommost electrically conductive layers 346 comprise source select gate electrodes of a three-dimensional NAND device. The remaining electrically conductive layers 46 comprise word lines (i.e., control gate electrodes) and drain select gate electrodes (which comprise one or more topmost layers 46).

Each sacrificial material layer 42 can be replaced with an electrically conductive layer 46. A backside cavity 79' is present in the portion of each backside trench 79 that is not filled with the continuous metallic material layer 46L. A tubular dielectric spacer 116 laterally surrounds a pedestal channel portion 11. One or more bottommost electrically conductive layers (e.g., source select gate electrode(s)) 346 laterally surrounds each tubular dielectric spacer 116 upon formation of the electrically conductive layers 346. The dielectric spacer 116 functions as a gate dielectric of the source select transistor and the pedestal channel portion 11 functions as the channel of the source select transistor. In one embodiment, there is no annular metal portion 146 and no annular backside blocking dielectric (e.g., aluminum oxide dielectric) 51 at the level of the one or more bottommost electrically conductive layers (e.g., source select gate electrodes) 346.

Figure 10C:
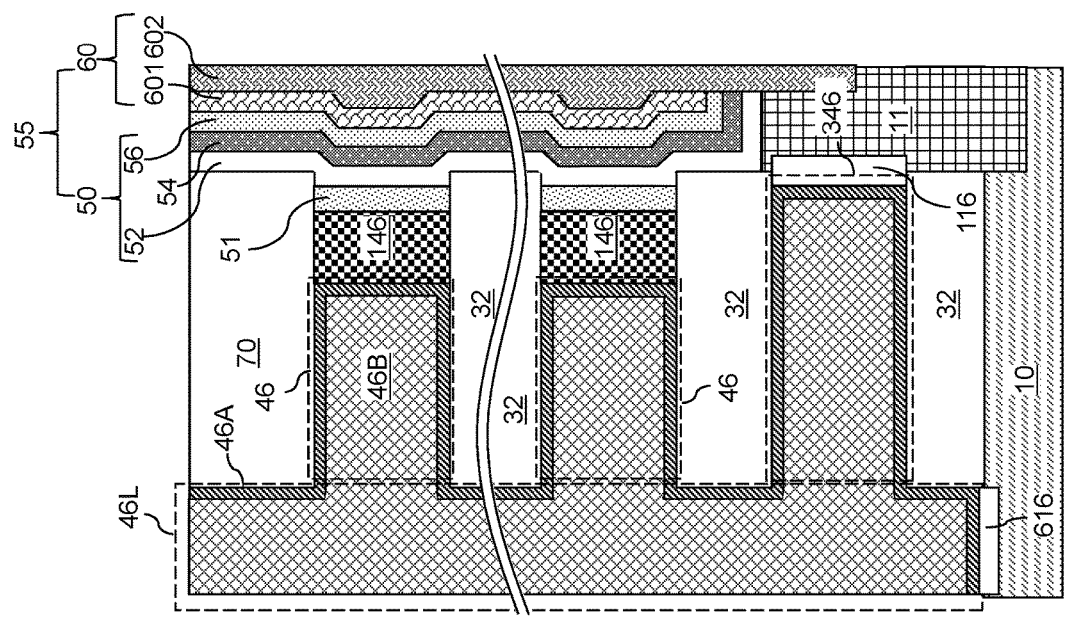
FIG. 10C is a vertical cross-sectional view of a region of a first alternative embodiment of the exemplary structure of FIG. 10A.
Figure 10D:
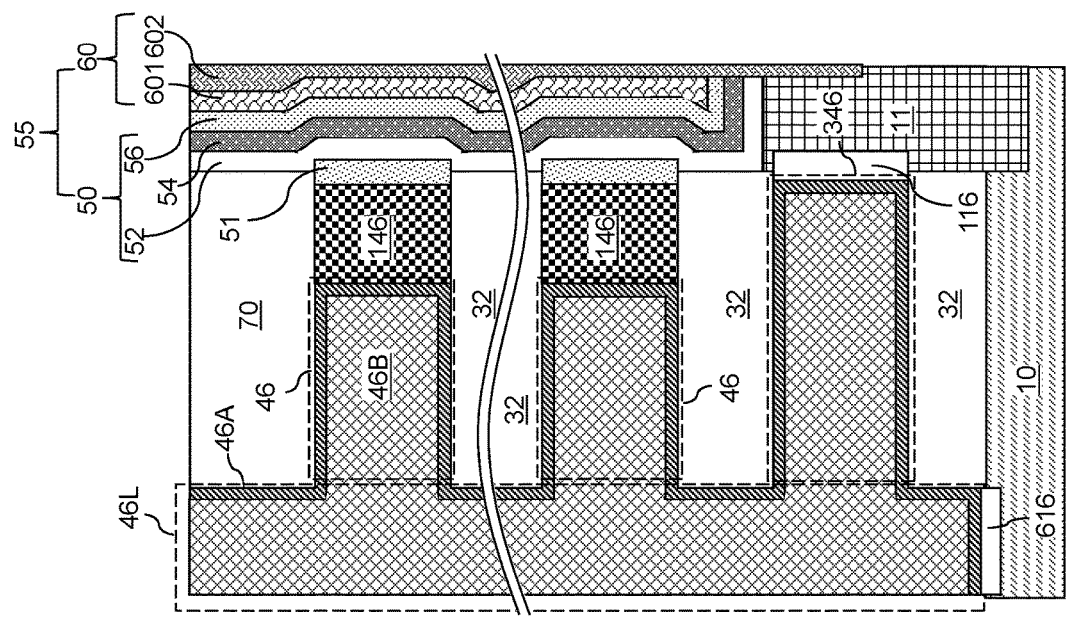
FIG. 10D is a vertical cross-sectional view of a region of a second alternative embodiment of the exemplary structure of FIG. 10A.

In one embodiment, the inner sidewalls of the annular backside blocking dielectrics 51 may be vertically coincident with sidewalls of the insulating layers 32. Alternatively, the inner sidewalls of the annular backside blocking dielectrics 51 may be laterally recessed outward from a vertical plane including sidewalls of the insulating layers 32, as illustrated in FIG. 10C, which illustrates a first alternative embodiment of the exemplary structure. Yet alternatively, the inner sidewalls of the annular backside blocking dielectrics 51 may protrude inward toward a vertical axis passing through a geometrical center of a most proximal memory stack structure 55 from a vertical plane including sidewalls of the insulating layers 32, as illustrated in FIG. 10D, which illustrates a second alternative embodiment of the exemplary structure.

Figure 11A:
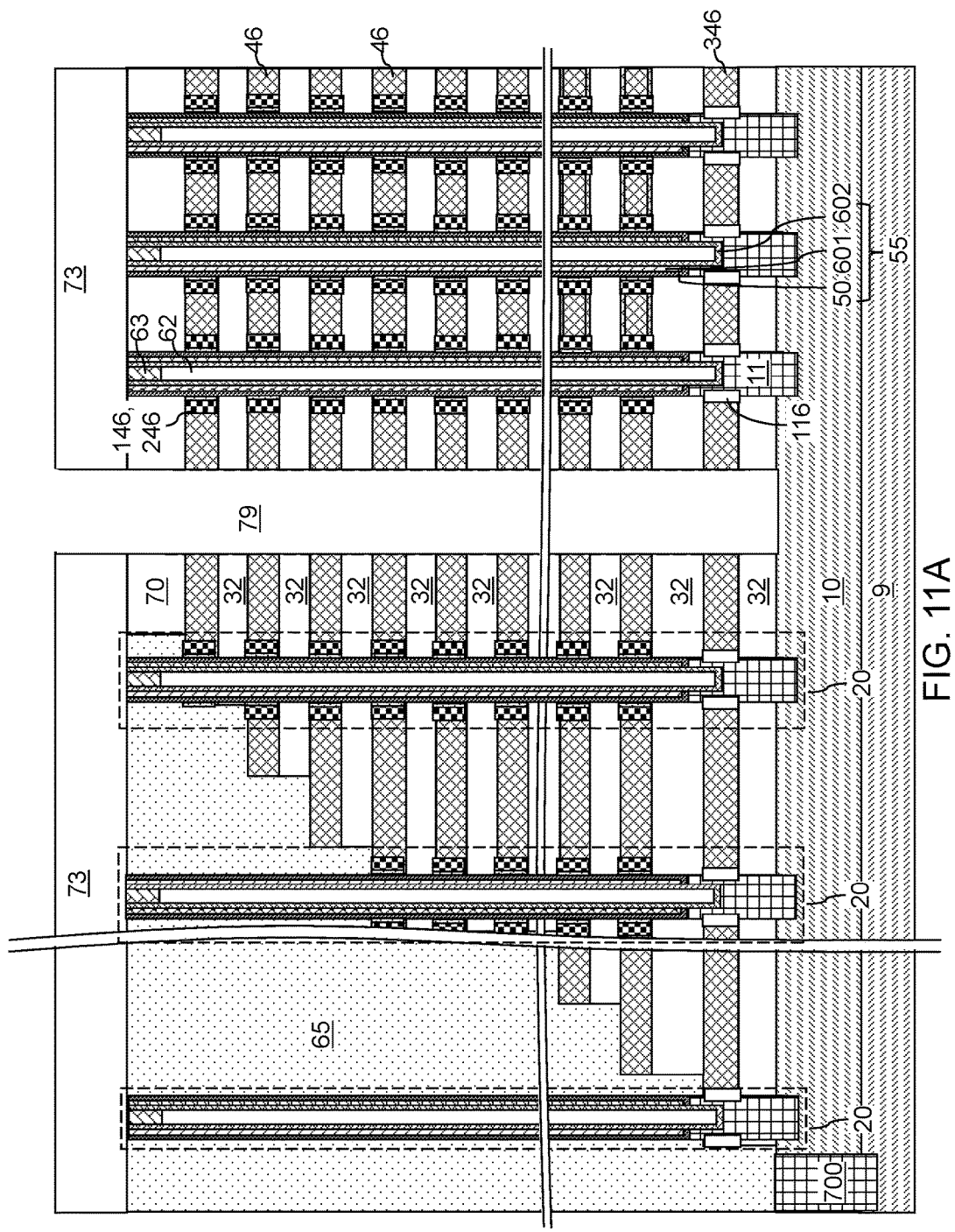
FIG. 11A is a schematic vertical cross-sectional view of the exemplary structure after removal of a deposited conductive material from within the backside trenches according to an embodiment of the present disclosure.
Figure 11B:
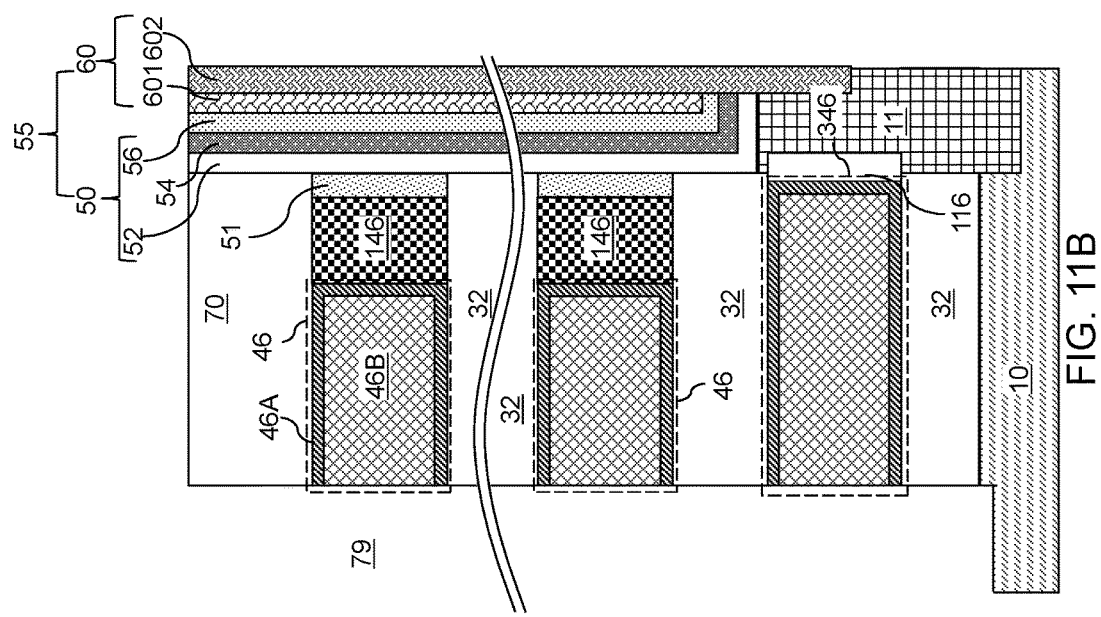
FIG. 11B is a vertical cross-sectional view of a region of the exemplary structure of FIG. 11A.

Referring to FIGS. 11A and 11B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. The planar dielectric portions 616 can be removed during removal of the continuous electrically conductive material layer 46L.

Figure 12A:
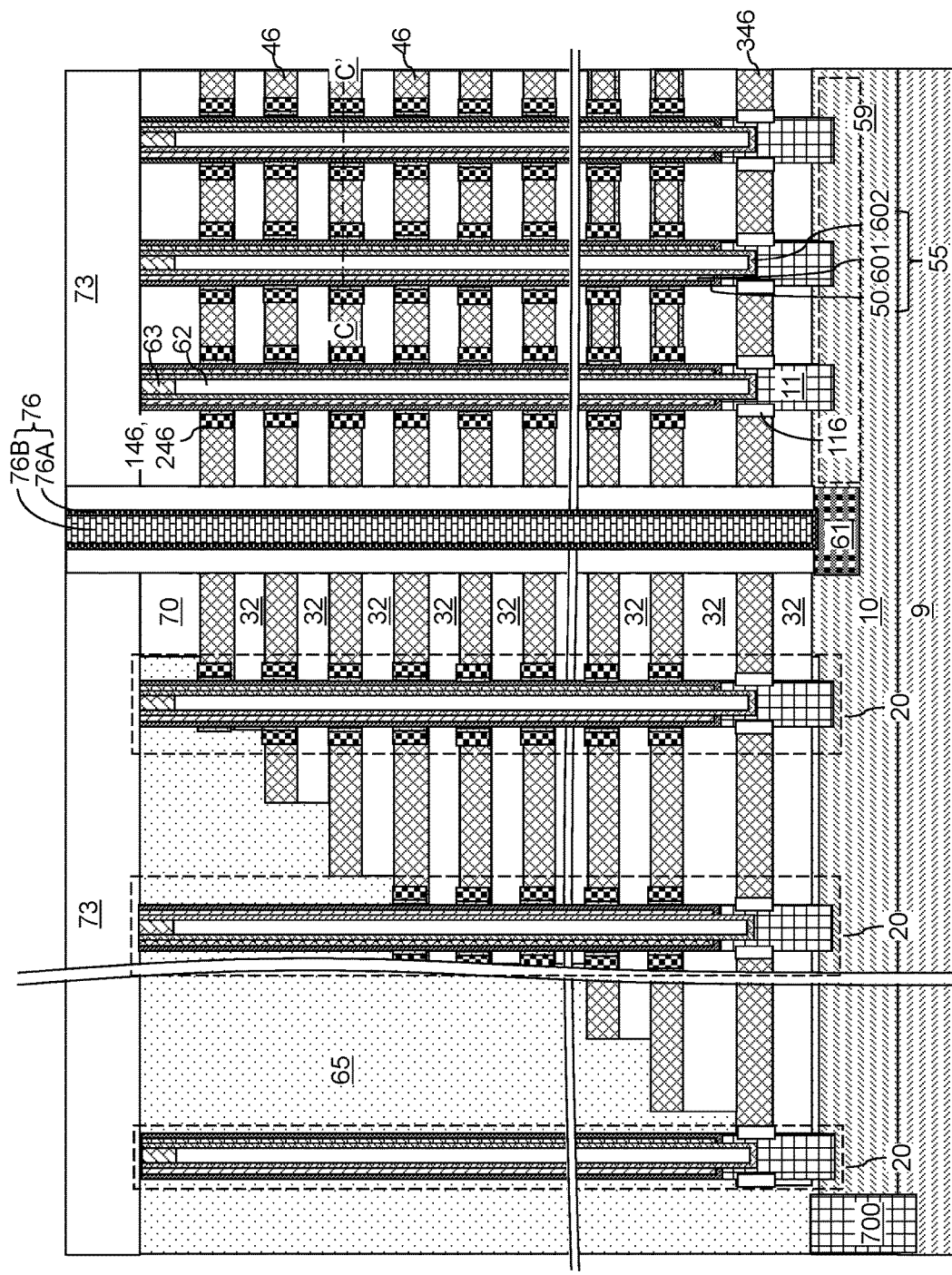
FIG. 12A is a schematic vertical cross-sectional view of the exemplary structure after formation of an insulating spacer and a backside contact structure within each backside trench according to an embodiment of the present disclosure.
Figure 12B:
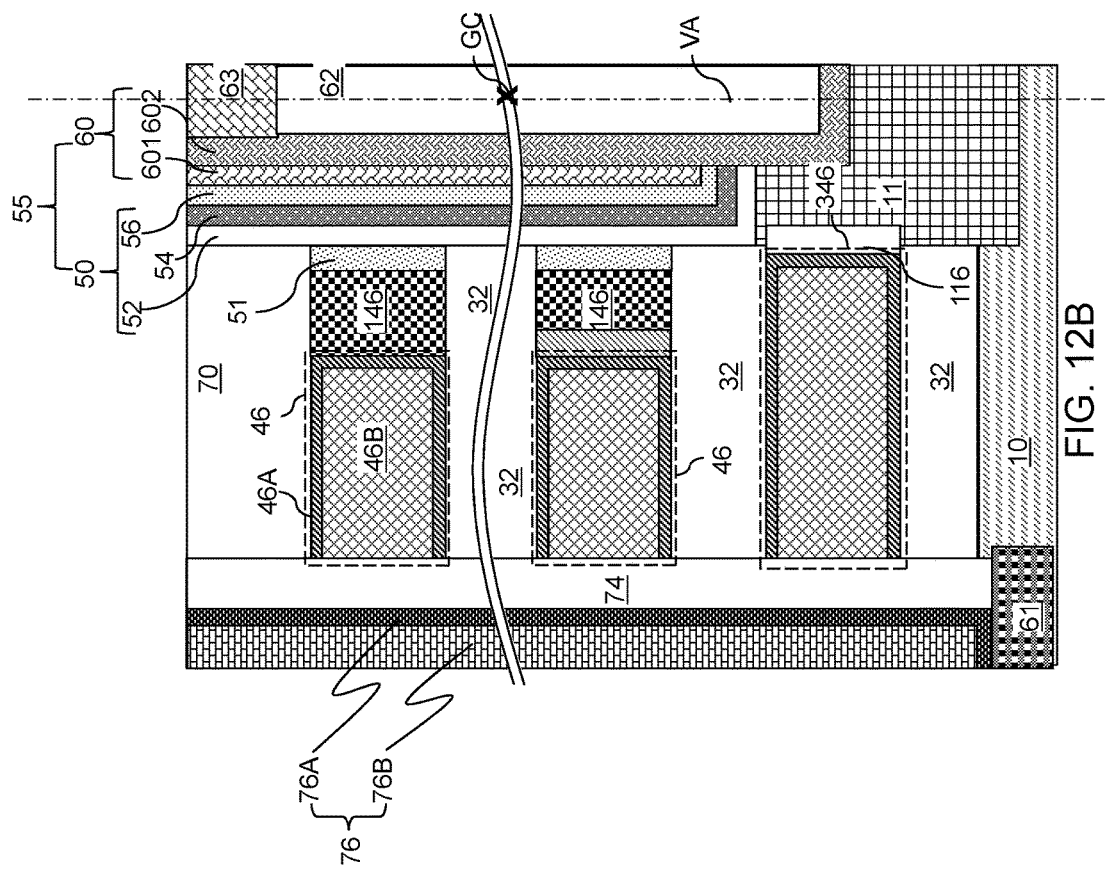
FIG. 12B is a vertical cross-sectional view of a region of the exemplary structure of FIG. 12A.
Figure 12C:
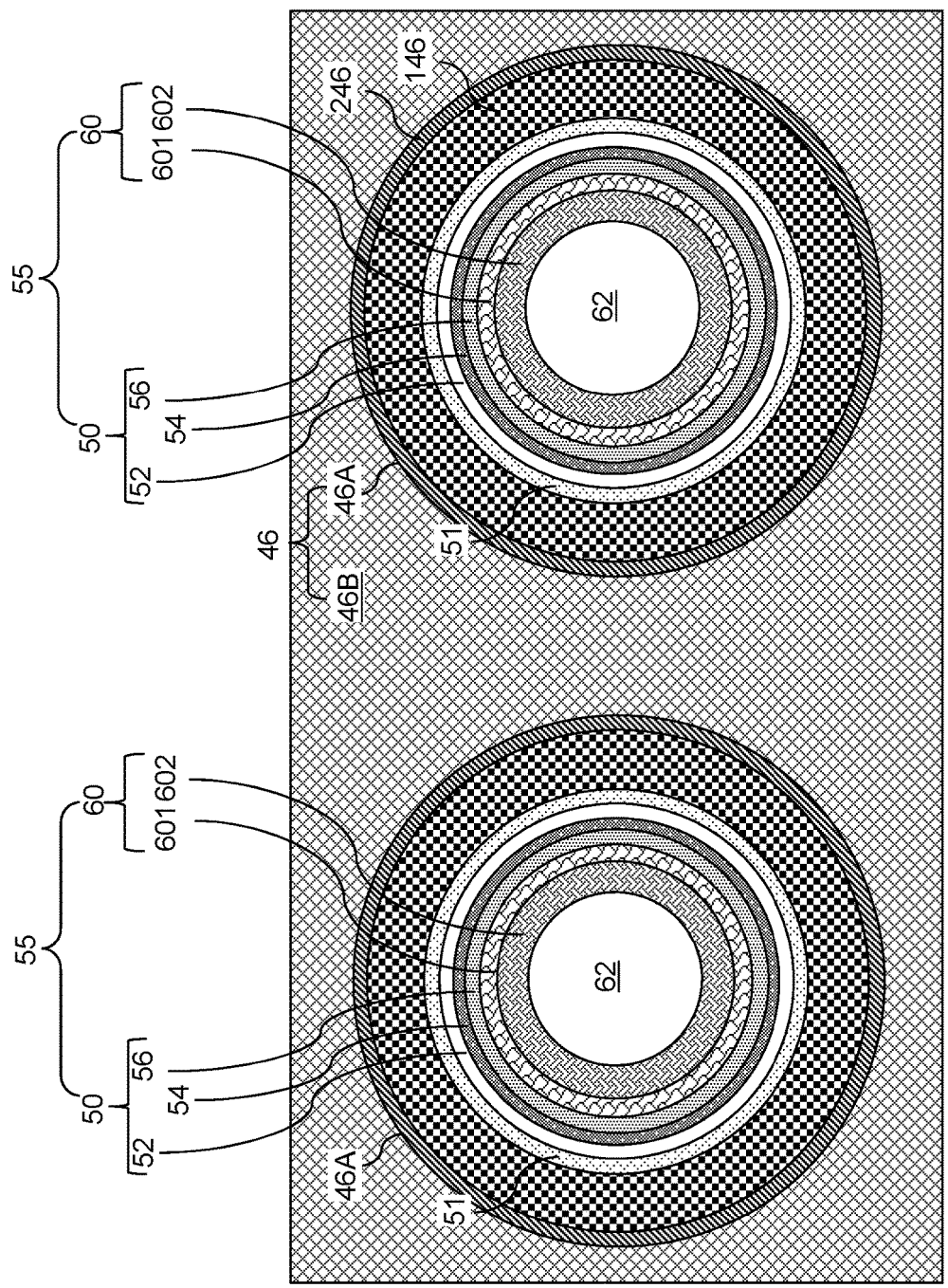
FIG. 12C is a horizontal cross-sectional view of a region C-C' of the exemplary structure of FIG. 12A.

Referring to FIGS. 12A-12C, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 12D:
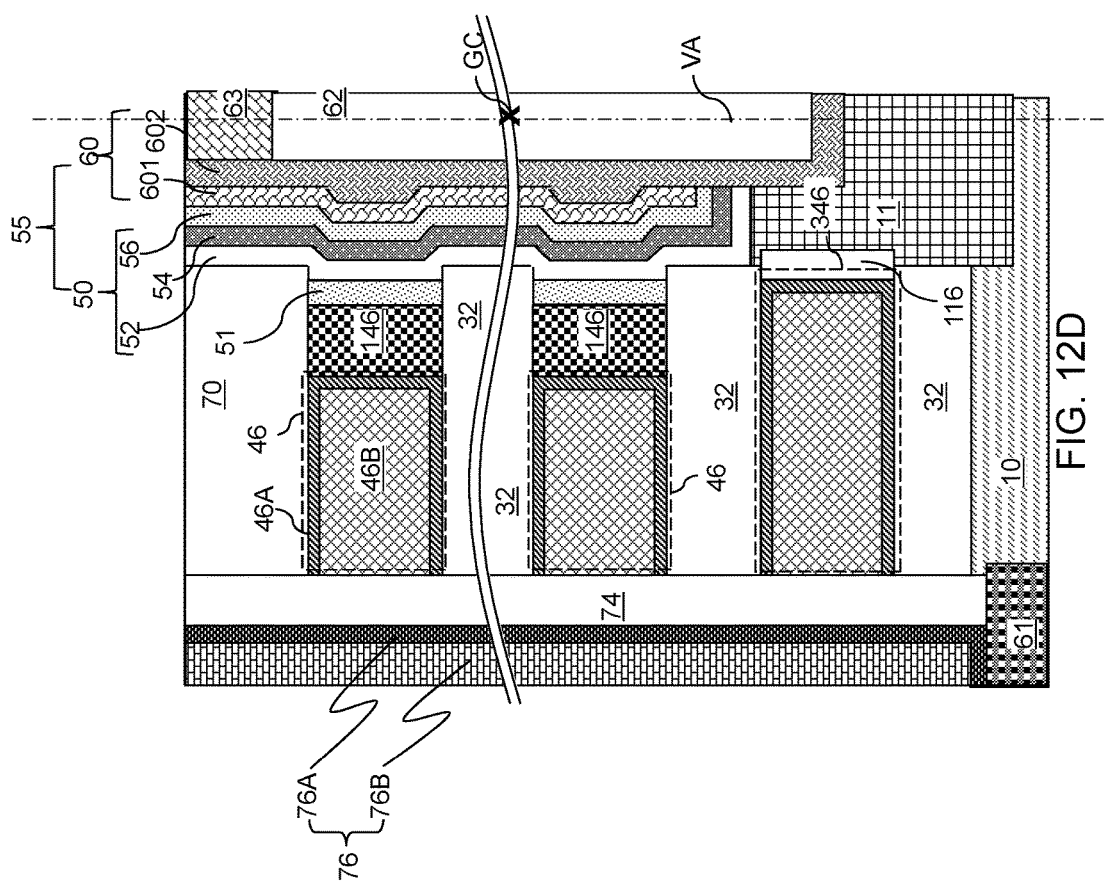
FIG. 12D is a vertical cross-sectional view of a region of a first alternative embodiment of the exemplary structure of FIG. 12A.

Alternatively, the inner sidewalls of the annular backside blocking dielectrics 51 may be laterally recessed outward from a vertical plane including sidewalls of the insulating layers 32, as illustrated in FIG. 12D, which illustrates a first alternative embodiment of the exemplary structure. Yet alternatively, the inner sidewalls of the annular backside blocking dielectrics 51 may protrude inward toward a vertical axis passing through a geometrical center of a most proximal memory stack structure 55 from a vertical plane including sidewalls of the insulating layers 32, as illustrated in FIG. 12E, which illustrates a second alternative embodiment of the exemplary structure.

The memory stack structure 55 is located within a memory opening that extends through the alternating stack (32, 46). In one embodiment, sidewalls of the insulating layers 32 that contact the memory film 50 are equidistant from a vertical axis VA passing through a geometrical center GC of the memory opening as inner sidewalls of the annular backside blocking dielectrics 51 that contact the memory film 50 are from the vertical axis VA passing through the geometrical center GC of the memory opening, as illustrated in FIG. 12B.

In another embodiment, the sidewalls of the insulating layers 32 that contact the memory film 50 are more proximal to a vertical axis VA passing through a geometrical center GC of the memory opening than inner sidewalls of the annular backside blocking dielectrics 51 that contact the memory film 50 are to the vertical axis VA passing through the geometrical center GC of the memory opening, as illustrated in FIG. 12D.

Figure 12E:
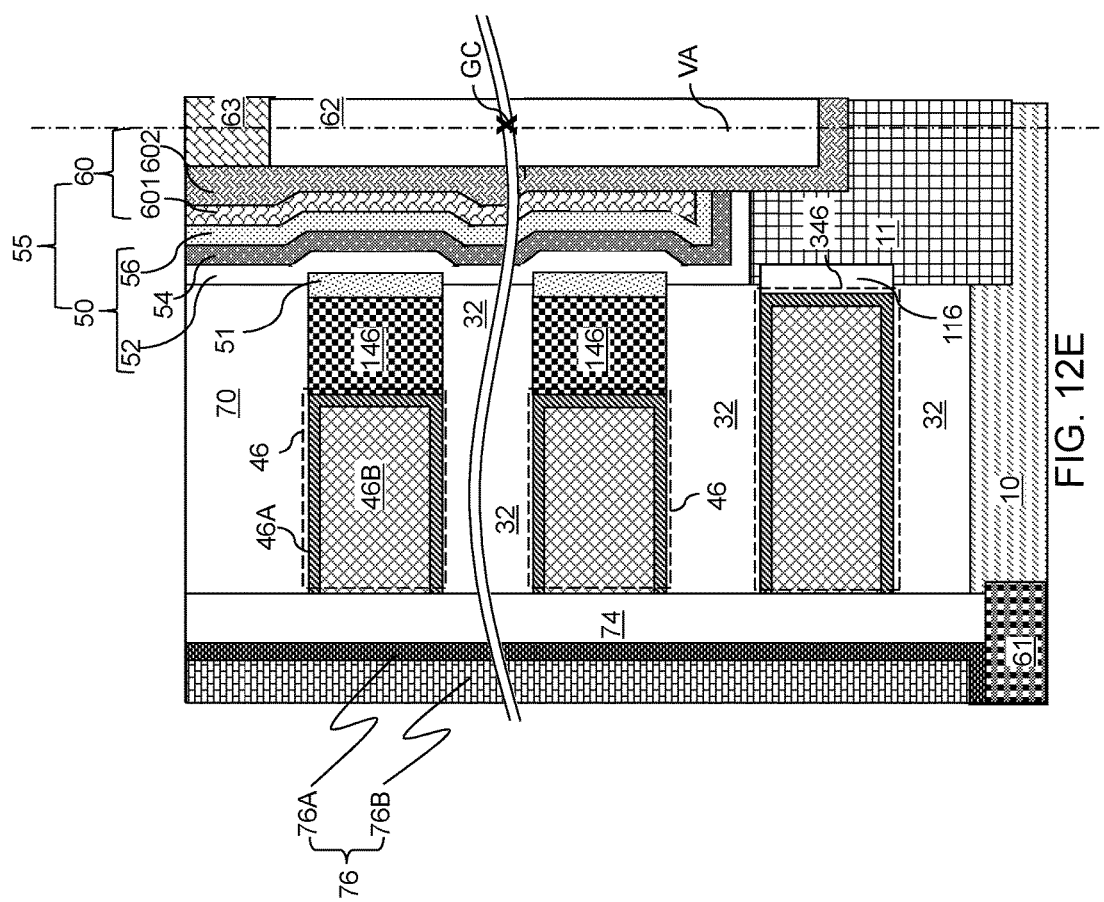
FIG. 12E is a vertical cross-sectional view of a region of a second alternative embodiment of the exemplary structure of FIG. 12A.

In yet another embodiment, the sidewalls of the insulating layers 32 that contact the memory film 50 are more distal from a vertical axis VA passing through a geometrical center GC of the memory opening than inner sidewalls of the annular backside blocking dielectrics 51 that contact the memory film 50 are from the vertical axis VA passing through the geometrical center GC of the memory opening, as illustrated in FIG. 12E.

Figure 13A:
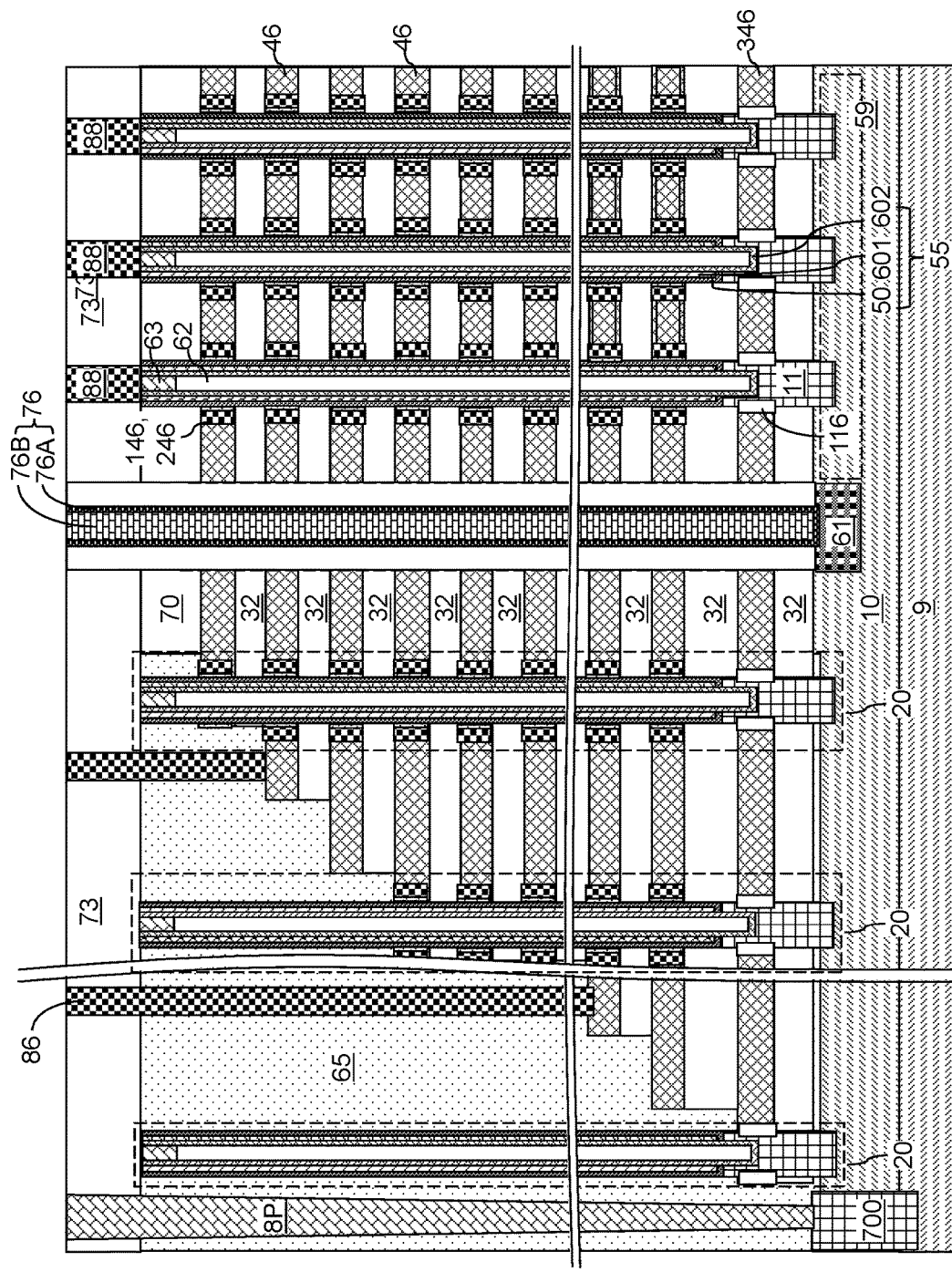
FIG. 13A is a schematic vertical cross-sectional view of the exemplary structure after formation of additional contact via structures according to an embodiment of the present disclosure.
Figure 13B:
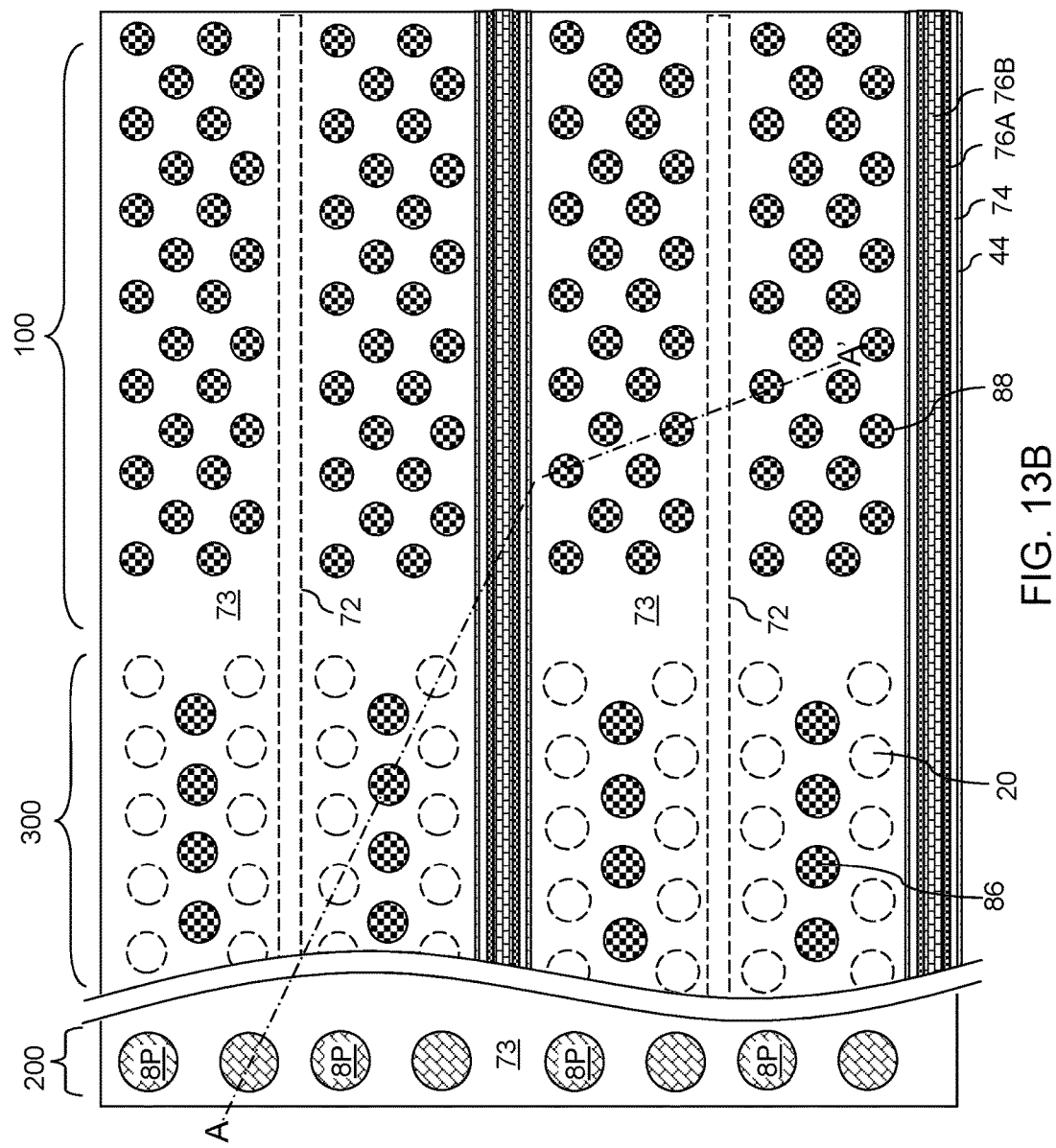
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings of the present disclosure, the exemplary structure of the present disclosure can include a three-dimensional memory device. The three-dimensional memory device can include: an alternating stack of insulating layers 32 and electrically conductive layers 46 located over a substrate (9, 10); a memory stack structure 55 extending through the alternating stack (32, 46), wherein the memory stack structure 55 comprises a memory film 50 and a vertical semiconductor channel 60 contacting an inner sidewall of the memory film 50; discrete annular backside blocking dielectrics 51 located at levels of at least some of the electrically conductive layers 46 and laterally surrounding the memory stack structure 55; and annular metal portions 146 located at levels of the at least some of the electrically conductive layers 46 and contacting and an outer sidewall of a respective one of the annular backside blocking dielectrics 51.

As used herein, "discrete" annular backside blocking dielectrics 51 means that the dielectrics 51 located at different vertical levels (e.g., at levels of different electrically conductive layers 46) around the same memory stack structure 55 do not contact each other.

In one embodiment, each of the annular metal portions 146 contacts a cylindrical sidewall of a respective one of the electrically conductive layers 46. In one embodiment, each of the electrically conductive layers 46 comprises a metallic liner 46A comprising a conductive metal nitride 46A; and a metal fill portion 46B contacts the metallic liner 46A, wherein some of the metallic liners 46A contact a respective subset of the annular metal portions 146 that are located between vertically neighboring pairs of the insulating layers 32.

In one embodiment, each of the annular backside blocking dielectrics 51 includes an annular top surface that contacts a bottom surface of a respective overlying one of the insulating layers 32, and an annular bottom surface that contacts a top surface of a respective underlying one of the insulating layers 32. In one embodiment, each of the annular metal portions 146 includes an annular top surface that contacts a bottom surface of a respective overlying one of the insulating layers 32, and an annular bottom surface that contacts a top surface of a respective underlying one of the insulating layers 32.

In one embodiment, the electrically conductive layers (46, 346) comprise word lines 46 and at least one source select gate electrode 346. The annular metal portions 146 and the discrete annular backside blocking dielectrics 51 are located at levels of the word lines 46. However, the annular metal portions 146 and the discrete annular backside blocking dielectrics 51 are not located at levels of the at least one source select gate electrode 346.

In one embodiment, each of the annular metal portions 146 has a respective outer cylindrical sidewall and a respective inner cylindrical sidewall that is laterally offset inward from the respective outer cylindrical sidewall by a uniform lateral thickness. In one embodiment, each of the discrete annular backside blocking dielectrics 51 has a uniform lateral thickness and does not have a clam shape. A "clam" shape is a side cross sectional shape configured similar to an English letter "C". A clam shape has two segments which extend substantially parallel to each other and to the major surface 7 of the substrate (9, 10). The two segments are connected to each other by a third segment which extends substantially perpendicular to the first two segments and the surface 7. Thus, the discrete annular backside blocking dielectrics lack the two segments which extend substantially parallel to each other.

In one embodiment, the memory film 50 comprises a layer stack including, from outside to inside, a silicon oxide blocking dielectric layer 52, a charge storage layer 54, and a tunnel dielectric layer 56; and the blocking dielectric layer 52 contacts the annular backside blocking dielectrics 51 which comprise aluminum oxide.

In one embodiment, the annular metal portions 146 consist essentially of an elemental metal. In one embodiment, the elemental metal is an element select from ruthenium and molybdenum.

The exemplary structures can include a three-dimensional memory device. In one embodiment, the three-dimensional memory device comprises a monolithic three-dimensional NAND memory device. Each of the electrically conductive layers 46 can be a component of a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

Some of the electrically conductive layers 46 function as word lines for a three-dimensional memory device. The annular metal portions 146 can be considered portions of the word lines. Because the annular blocking dielectric portions 51 do not include horizontal portions that extend between each vertically neighboring pair of a word line and an insulating layer 32, each word line can have a height that is the same as a vertical separation distance between a neighboring pair of insulating layers 32, and thus, can provide a low electrical resistance compared to a structure including horizontal portions of a backside blocking dielectric layer. Thus, the methods and the structure of the present disclosure can reduce RC delay in the word lines and provide superior performance compared to prior art devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
    forming an alternating stack of insulating layers and sacrificial material layers over a substrate;
    forming a memory opening through the alternating stack;
    forming annular recesses around the memory opening by laterally recessing the sacrificial material layers with respect to the insulating layers;
    forming annular metal portions over recessed sidewalls of the sacrificial material layers within each of the annular recesses through the memory opening;
    selectively forming discrete annular backside blocking dielectrics on inner sidewalls of the annular metal portions;
    forming a memory stack structure on inner sidewalls of the annular backside blocking dielectrics in the memory opening, wherein the memory stack structure comprises a memory film and a vertical semiconductor channel contacting an inner sidewall of the memory film; and
    replacing the sacrificial material layers with electrically conductive layers;
    wherein:
    the electrically conductive layers comprise word lines and at least one source select gate electrode;
    the annular metal portions and the discrete annular backside blocking dielectrics are located at levels of the word lines; and
    the annular metal portions and the discrete annular backside blocking dielectrics are not located at levels of the at least one source select gate electrode.

2. The method of claim 1, wherein the annular metal portions are formed by a selective metal deposition process that grows a metal of the annular metal portions over recessed sidewalls of the sacrificial material layers without growing the metal from surfaces of the insulating layers.

3. The method of claim 2, wherein:
    the annular metal portions are formed by the selective metal deposition process that grows the metal of the annular metal portions directly on recessed sidewalls of the sacrificial material layers without growing the metal from surfaces of the insulating layers;
    the annular metal portions comprise ruthenium;
    the insulating layers comprise silicon oxide; and
    the sacrificial material layers comprise silicon nitride.

4. The method of claim 1, wherein the annular backside blocking dielectrics are formed by a selective dielectric material deposition process that grows a dielectric material of the annular backside blocking dielectrics without growing the dielectric material from surfaces of the insulating layers.

5. The method of claim 4, further comprising selectively coating physically exposed surfaces of the insulating layers with a monolayer of a self-assembly material that adheres to the physically exposed surfaces of the insulating layers without adhering to the annular metal portions, wherein the self-assembly material inhibits nucleation of the dielectric material of the annular backside blocking dielectrics during the step of selectively forming the discrete annular backside blocking dielectrics.

6. The method of claim 5, further comprising removing the monolayer of a self-assembly material after formation of the annular backside blocking dielectrics and prior to formation of the memory stack structure.

7. The method of claim 1, wherein the sacrificial material layers are replaced with electrically conductive layers by:
removing the sacrificial material layers selective to the insulating layers and the annular metal portions to form backside recesses;
depositing a metallic liner comprising a conductive metal nitride over outer surfaces of the annular metal portions and horizontal surfaces of the insulating layers that are exposed to the backside recesses; and
depositing a metal fill portion in each remaining volume of the backside recesses, wherein each combination of a metal fill portion and an adjoining portion of the metallic liner constitutes one of the electrically conductive layers.

8. The method of claim 1, wherein:
each of the memory films comprises a layer stack including, from outside to inside, a front side silicon oxide blocking dielectric layer, a charge storage layer, and a tunnel dielectric layer; and
the front side silicon oxide blocking dielectric layer is formed on sidewalls of the annular backside blocking dielectrics which comprises aluminum oxide and on sidewalls of the insulating layers.

9. The method of claim 1, further comprising:
selectively forming annular semiconductor portions on each physically exposed sidewall of the sacrificial material layers through the memory opening, wherein the annular metal portions are selectively formed directly on the annular semiconductor portions;
selectively removing the sacrificial material layers and the annular semiconductor portions to form backside recesses; and
forming the electrically conductive layers in the backside recesses to replace the sacrificial material layers and the annular semiconductor portions with the electrically conductive layers.

10. The method of claim 9, wherein the annular semiconductor portions comprise silicon, silicon-germanium or germanium, and the annular metal portions comprise molybdenum.

11. A method of forming a three-dimensional memory device, comprising:
forming an alternating stack of insulating layers and sacrificial material layers over a substrate;
forming a memory opening through the alternating stack;
forming annular recesses around the memory opening by laterally recessing the sacrificial material layers with respect to the insulating layers;
forming annular metal portions over recessed sidewalls of the sacrificial material layers within each of the annular recesses through the memory opening;
selectively forming discrete annular backside blocking dielectrics on inner sidewalls of the annular metal portions;
forming a memory stack structure on inner sidewalls of the annular backside blocking dielectrics in the memory opening, wherein the memory stack structure comprises a memory film and a vertical semiconductor channel contacting an inner sidewall of the memory film; and
replacing the sacrificial material layers with electrically conductive layers;
wherein:
the three-dimensional memory device comprises a monolithic three-dimensional NAND memory device;
each of the electrically conductive layers is a component of a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

* * * * *